United States Patent [19]

Toda

[11] Patent Number: 4,999,536
[45] Date of Patent: Mar. 12, 1991

[54] VIBRATOR-TYPE ACTUATOR

[76] Inventor: Kohzi Toda, 1-49-18, Futaba, Yokosuka, Japan

[21] Appl. No.: 357,733

[22] Filed: May 26, 1989

[30] Foreign Application Priority Data

| May 26, 1988 | [JP] | Japan | 63-129122 |
| Jun. 24, 1988 | [JP] | Japan | 63-157506 |
| Jun. 25, 1988 | [JP] | Japan | 63-157712 |
| Sep. 16, 1988 | [JP] | Japan | 62-231726 |
| Sep. 16, 1988 | [JP] | Japan | 63-231727 |
| Dec. 9, 1988 | [JP] | Japan | 63-311453 |

[51] Int. Cl.$^5$ .......................... H01L 41/08
[52] U.S. Cl. ................... 310/323; 310/369; 310/328; 310/359; 310/366
[58] Field of Search .......... 310/323, 328, 358, 359, 310/366-369

[56] References Cited

U.S. PATENT DOCUMENTS

| 2,838,695 | 6/1958 | Thurston | 310/333 X |
| 2,838,696 | 6/1958 | Thurston | 310/333 X |
| 2,870,521 | 1/1959 | Rudnick | 310/369 X |
| 3,171,696 | 3/1965 | Houghton | 310/333 X |
| 3,211,931 | 10/1965 | Tehon | 310/333 |
| 4,019,073 | 4/1977 | Vishnevsky et al. | 310/330 X |
| 4,400,641 | 8/1983 | Vishnevsky et al. | 310/369 X |
| 4,453,103 | 6/1984 | Vishnevsky et al. | 310/328 X |
| 4,634,916 | 1/1987 | Okada et al. | 310/328 X |
| 4,663,556 | 5/1987 | Kumada | 310/328 X |
| 4,734,610 | 3/1988 | Okumura et al. | 310/328 X |

FOREIGN PATENT DOCUMENTS

| 197709 | 9/1977 | U.S.S.R. | 310/328 |
| 0817816 | 4/1981 | U.S.S.R. | 310/323 |
| 0845198 | 7/1981 | U.S.S.R. | 310/328 |
| 0851560 | 7/1981 | U.S.S.R. | 310/323 |
| 0851563 | 7/1981 | U.S.S.R. | 310/369 |
| 0987714 | 1/1983 | U.S.S.R. | 310/323 |
| 399036 | 3/1984 | U.S.S.R. | 310/328 |
| 1287088 | 1/1987 | U.S.S.R. | 310/328 |

OTHER PUBLICATIONS

Japanese Journal of Applied Physics, vol. 27 (1988), Supp. 27-1, pp. 195-197, "Construction of Ultrasonic Motors and Their Application", Y. Tomikawa et al.
Japanese Journal of Applied Physics, vol. 27 (1988) Supp. 27-1, pp. 192-194, "Ultrasonic Motors Using Piezoelectric Ceramic Multi-Mode . . . ", T. Takano et al.
Japanese Journal of Applied Physics, vol. 24 (1985), Supp. 24-2, pp. 739-741, "A Piezoelectric Ultrasonic Motor", A. Kumada.

Primary Examiner—Mark O. Budd
Attorney, Agent, or Firm—Cushman, Darby & Cushman

[57] ABSTRACT

An actuator includes a pillar shaped ceramic piezoelectric body, a pair of electrodes formed on both base surfaces of the piezoelectric body, and a moving element made to contact with the side surface of the piezoelectric body in the longitudinal direction. A sheet provided in the longitudinal direction between two piezoelectric bodies is moved by driving the piezoelectric bodies. A roller is made to contact with the side of the piezoelectric body and a paper is pressed against the roller for feeding the paper. The side surface in the longitudinal direction of the foregoing piezoelectric body can alternatively be made to contact with the surface of a rail which guides the piezoelectric body movement.

19 Claims, 23 Drawing Sheets

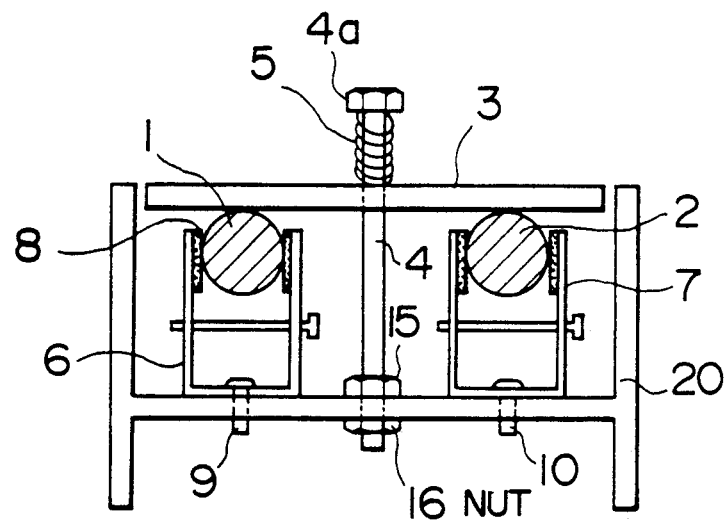
FIG. IA
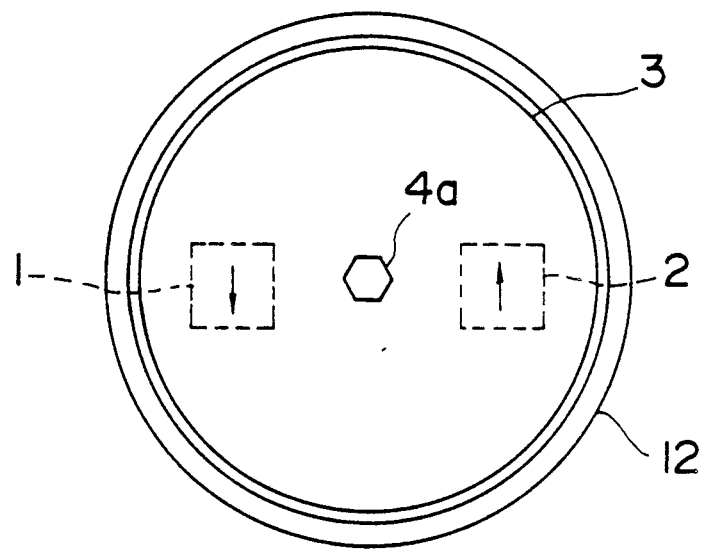
FIG. IB

| MATERIALS | SHAPE | FREQUENCY | EXPERIMENTAL RESULT | THEORETICAL VALUE |
|---|---|---|---|---|
| TDK-71B | D10-10 | $f_1$<br>$f_2$ | 128.0<br>201.5 | 118.5<br>220.6 |
| TDK-71B | D10-7.31 | $f_1$<br>$f_2$ | 158.0<br>220.0 | 145.44<br>247.4 |
| TDK-71B | D5-10 | $f_1$<br>$f_2$ | 138.0 | 128.4<br>556.97 |
| TDK-71B | D5-8 | $f_1$<br>$f_2$ | 163.0<br>420.0 | 157.53<br>415.67 |
| TDK-91C | D10-10 | $f_1$<br>$f_2$ | 135.0<br>215.5 | 123.3<br>235.8 |
| TDK-91C | D10-7.31 | $f_1$<br>$f_2$ | 164.0<br>228.0 | 150.9<br>263.75 |
| TDK-91C | D10-5 | $f_1$<br>$f_2$ | 192.0<br>278.0 | 171.1<br>339.9 |

FIG. 2

VIBRATION DISPLACEMENT AT $f = 248.2 \text{ kHz}$

VIBRATION DISPLACEMENT AT $f = 348.2 \text{ kHz}$

VIBRATOR-TYPE ACTUATOR

BACKGROUND OF THE INVENTION

The present invention relates to a vibrator-type actuator. More particularly the present invention is directed to a simple vibrator-type actuator having a simple construction and using a piezoelectric-vibrator as an electromechanical conversion-means.

Vibrator-type actuators using piezoelectric vibrators as the electromechanical conversion means have been intentionally developed for applications in small-sized and high-torque producing devices, i.e., precision mechanical equipment, such as automatic focusing cameras, printers, copy machines and video cassette recorders. They are also applicable as card transferring devices in card identifying apparatuses for use in banks, and as object transferring devices for use in industrial robot FMSs (Flexible Manufacturing Systems). Ultrasonic motors have been in practical use as such a vibrator-type actuator.

The ultrasonic motors are, generally, classified into three kinds of systems. The first is a so-called "travelling wave-type" or "mode rotation-type"; the second is a "standing wave-type" based upon the standing wave; and the third is a multiresonance-type". The typical structure and operational principle are disclosed in the following papers: "Ultrasonic Motors Using Piezoelectric Multi-Mode Vibrators" by TAKEHIRO TA-NAKA et al., JAPANESE JOURNAL OF APPLIED PHYSICS, VOL.27 (1988) SUPPLEMENT 27-1, pp. 192-194, "A Piezoelectric Ultrasonic Motor" by AKIO KUMADA, JAPANESE JOURNAL OF APPLIED PHYSICS, VOL.24 (1985), SUPPLEMENT 24-2, PP.739-741, and "Construction of Ultrasonic Motors and their Application" by YOSHIRO TOMIKAWA et al., JAPANESE JOURNAL OF APPLIED PHYSICS, VOL.27 (1988) SUPPLEMENT 27-1, pp.195-197.

However, the conventionally known ultrasonic motors are complex in both the mechanical and circuit structure of the driving circuit for the piezoelectric vibrator, making it difficult to achieve miniaturization and cost reduction.

A paper feed apparatus smoothly feeding a paper to a predetermined position has been employed in the copy machine, facsimile, printer and the like. In the conventional paper feed machine the paper is held by two rollers and is fed by rotating at least one roller through the use of an electromagnetic motor. However, the electromagnetic motor is complex in structure and requires a speed reduction mechanism since it produces an extremely small torque at a low rotation speed. Thus the conventional paper feed apparatus has the disadvantages of being complex and of being a large-sized structure with attendant high cost.

Furthermore, in the FSM an object to be manufactured (called "work" hereinafter) is linearly moved or transferred by the gears which convert the mechanical rotational movement of the electromagnetic motor into linear movement. Such a conventional work moving apparatus necessitates an electromagnetic motor and gears and is therefore complex in structure and large in size. The movement of the object along a curved rail has also been widely employed in various automatic machines such as an industrial robot as well as an FMS. The electromagnetic motor and gears are also necessary for the industrial robot, causing the same disadvantages as those of the FMS.

As an actuator which converts electrical energy into mechanical energy, an ultrasonic motor is employed. The ultrasonic motor has superior characteristics to the electromagnetic motor. Namely, the ultrasonic motor produces a larger torque at lower rotational speed than an electromagnetic motor of the same size. The conventional ultrasonic motor requires, however, a complex mechanical structure and driving circuit for the piezoelectric vibrator as stated above. As a result, the use of conventional ultrasonic motors makes miniaturization and cost reduction difficult.

SUMMARY OF THE INVENTION

An object of the invention is, therefore, to provide a vibrator-type actuator having both simplified mechanical structure of the piezoelectric vibrator and high reliability.

Another object of the present invention is to provide a vibrator-type actuator having a simplified driving circuit of the piezoelectric vibrator.

Other objects of the present invention are to provide a vibrator-type actuator capable of low power consumption, high speed operation and large torque production.

Still another object of the present invention is to provide a vibrator-type actuator having the foregoing advantages and being capable of arbitrarily controlling the vibration direction of the vibrator, or the moving direction of the moving element.

Still another object of the present invention is to provide a vibrator-type actuator having the foregoing advantages and small friction between the roller and the vibrator.

Still another object of the present invention is to provide a paper feed apparatus having a simplified structure and being capable of miniaturization and cost reduction.

A further object of the present invention is to provide a vibrator-type actuator capable of easy manufacture, miniaturization and cost reduction.

Another, object of the present invention is to provide a moving apparatus capable of producing a large torque, having a simplified driving circuit and a linear or curve movement along the rail.

According to one aspect of the present invention, there is provided a vibrator-type actuator comprising, a pillar shaped ceramic piezoelectric body; a pair of electrodes formed on both base surfaces of the piezoelectric body; and a moving element made to contact with the side surface of the piezoelectric body in the longitudinal direction.

According to another aspect of the present invention, there is provided an actuator apparatus comprising, a dink rotor rotating around an axis; at least one pillar shaped piezoelectric body on both base surfaces of which electrodes are formed and with the side surface of which the rotor is made to contact in the longitudinal direction; and a driving circuit for supplying a driving signal to the electrodes for driving the piezoelectric body.

According to another aspect of the present invention, there is provided an actuator apparatus comprising, two cylindrical piezoelectric bodies opposed and on each of the base surfaces of which an electrode is formed, a sheet moving element provided in the longitudinal direction between the two piezoelectric bodies; and a driving circuit for supplying a driving signal to the electrode so that the displacement direction on the side surfaces of the two cylindrical piezoelectric bodies are the same.

According to another aspect of the present invention, there is provided a paper feed apparatus comprising, a pillar shaped piezoelectric vibrator on both base surfaces of which a pair of electrodes are formed; a first roller made to contact with the side surface of the piezoelectric vibrator in the longitudinal direction and rotated by the circumference direction force due to the driving of the piezoelectric vibrator; a supporting means for maintaining the distance between the rotational axis of the first roller and the piezoelectric vibrator to stably give a contact pressure between the first roller and the piezoelectric vibrator; and a press means for pressing the first roller against a paper.

According to another aspect of the present invention, there is provided an actuator apparatus comprising, a square pillar shaped piezoelectric body on both base surfaces of which a pair of electrodes are formed; a driving circuit for supplying a driving signal to the electrodes to drive the piezoelectric body; and a moving element provided on the side surface perpendicular to the electrode surface of the piezoelectric body with a predetermined contact pressure.

According to still another aspect of the present invention, there is provided a moving apparatus comprising: a pillar shaped piezoelectric body on two base surfaces perpendicular to the poling axis on which a pair of electrodes are formed; a driving circuit for supplying a driving signal to the electrodes; and a rail at least a part of which is made to contact with the side surface in the longitudinal direction of the piezoelectric body and which guides the movement of the piezoelectric body.

In the above aspects of the present invention, at least one of the paired electrodes of the piezoelectric body may be electrically separated into two electrodes.

BRIEF DESCRIPTION OF THE DRAWINGS

FIGS. 1A and 1B show a sectional plan view and a plan view of one embodiment according to the present invention;

FIG. 2 shows a drawing representing coupling resonance frequencies of the cylindrical vibrator;

DETAILED DESCRIPTION OF THE INVENTION

Figure 3A:
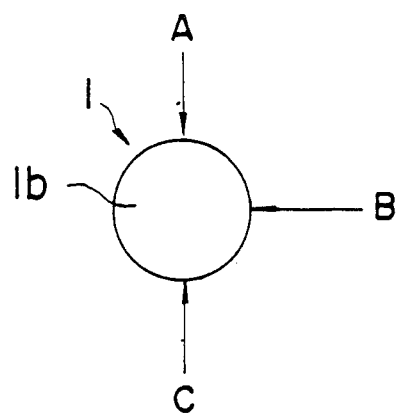
FIGS. 3A-3D, 4A-4C and 5A-5C show drawings representing the displacements on the side surfaces of the cylindrical vibrators having various lengths in the axial direction.

A pillar-shaped ceramic is employed as the piezoelectric vibrator in the present invention. A principle of the vibration on the cylindrical vibrator will be first described.

It has been reported that the vibration of the cylindrical vibrator is assumed to be two-dimensional coupling of the longitudinal vibration and the radial vibration. The resonance angular frequency Wr in the longitudinal direction is expressed by:

$$\omega_l^2 = \frac{\pi^2 \varepsilon}{l^2 \rho} \quad (1)$$

where l is a length of the cylindrical vibrator; ρ, a density; and E, Young's modulus.

The resonance angular frequency Wr in the radial direction ωr is given by:

$$\omega_r^2 = \frac{\zeta^2}{r^2(1-\sigma^2)} \frac{E}{\rho} \quad (2)$$

where r represents a radius of the cylindrical vibrator; σ, a Poison's ratio; and τ, a root of the following Bessel function.

$$\zeta J_o(\zeta) - (1-\sigma) J_1(\zeta) = 0 \quad (3)$$

In general, the resonance angular frequency of the isotropic vibrator is provided by the following formula;

$$\omega^6 = (1 - 3\mu^2 - 2\mu^3) - \omega^4(1-\mu^2)(\omega_a^2 + \omega_b^2 + \omega_c^2) + \quad (4)$$

$$\omega^2(\omega_a^2\omega_b^2 + \omega_b^2\omega_c^2 + \omega_c^2\omega_a^2) - \omega_a^2\omega_b^2\omega_c^2 = 0$$

A basic formula of the three-dimensional coupling vibration of the cylindrical vibrator is obtained using the relations, $$\omega_a = \omega_r$$
$$\omega_b = \omega_r$$
$$\omega_c = \omega_r \quad (5)$$

as $$\left(\omega^2 - \frac{1-\sigma}{1+\sigma}\omega_r^2\right)\left(\omega^4 \frac{(1+\sigma)(1-\sigma)}{1-\sigma} - \omega^2(\omega_l^2 + \omega_r^2) + \omega_l^2\omega_r^2\right) = 0 \quad (6)$$

Using the following relation $$1 - \eta^2 = \frac{(1+\mu)(1-2\mu)}{1-\mu}$$

the second term of the equation (6) is represented as:

$$\omega^4(1-\eta^2) - \omega^2(\omega_r^2 + \omega_l^2) + \omega_r^2\omega_l^2 + 0 \quad (7)$$

which obviously coincides with the two dimensional coupling equation of ωl and ωr having the coupling coefficient η. When the piezoelectric ceramic polarized in the longitudinal direction is driven, the vibration derived from the first term:

$$\omega^2 = \frac{1-\sigma}{1+\sigma}\omega_r^2 \quad (8)$$

is not observed.

FIG. 2 shows the experimental and theoretical first and second resonance frequencies f1 and f2 for different materials and different shape parameters. As the materials models, TDK 71B and TDK 91C (71B and 91C piezoelectric ceramic produced by TDK of Japan) were used. The shape parameters are diameter and length, for example in FIG 2, DlO 7.31 indicates that the diameter and longitudinal length are 10 mm and 7.31 mm, respectively. As seen from this drawing, the experimental and theoretical results on the coupling resonance angular frequencies of the cylindrical vibrator are well coincident one another.

Responsive to the alternative voltage application of the above-described coupling resonance frequency to the cylindrical-type vibrator polarized in the longitudinal direction, the vibration displacement is caused on the side surface of the vibrator. FIGS. 3A–3D schematically show the displacements on the side surfaces of the vibrator 1 when the alternative voltage of the first resonance angular frequency f1 is applied thereto. The cylindrical piezoelectric ceramic (TDK 91C) 1a is 10 mm in diameter (D=2r) and 10 mm in length and electrodes 1b and 1c are formed thereon. Here, it is to be noted that the thicknesses of the electrodes 1b and 1c are negligibly thin compared with the length of the piezoelectric ceramic.

Figure 3B:
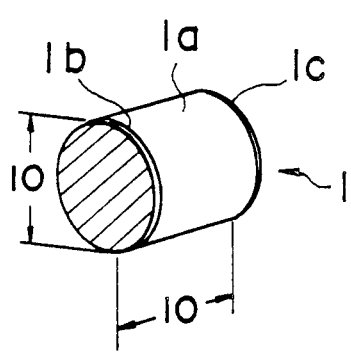
Figure 3C:
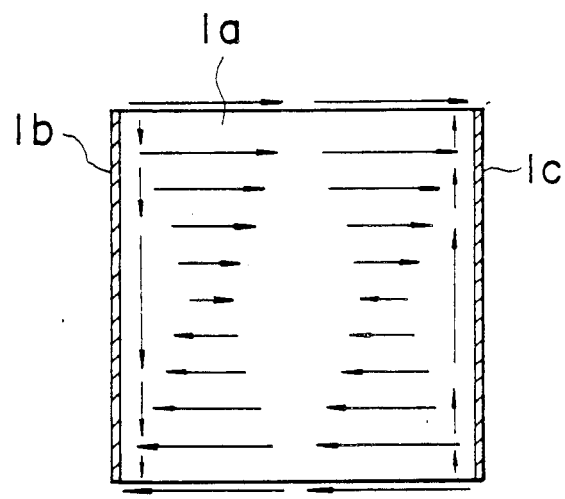
Figure 3D:
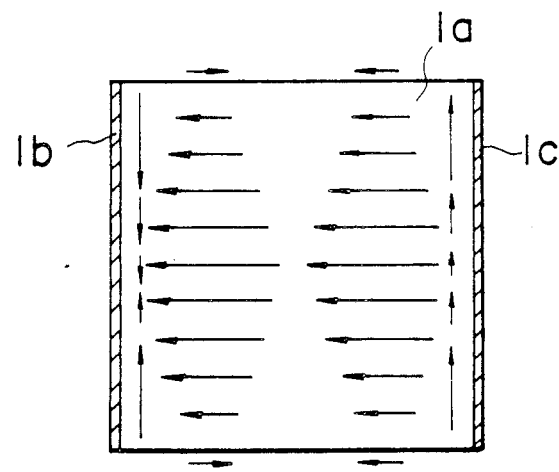

FIG. 3A is a side view of the cylindrical vibrator; FIG. 3B is a perspective view of the vibrator; FIG. 3C is a drawing indicating the vibration displacement on the side surface viewed from the direction of the arrow A; and FIG. 3D is a drawing indicating the vibration displacement on the side viewed from the direction of the arrow B. In these drawings, the arrow direction on the surface of the piezoelectric ceramic 1a indicates the direction of the vibration displacement and the arrow length indicates the magnitude of the vibration displacement.

Figure 4A:
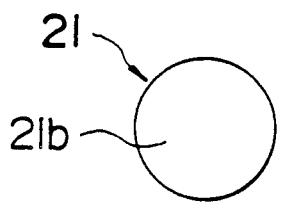
Figure 4B:
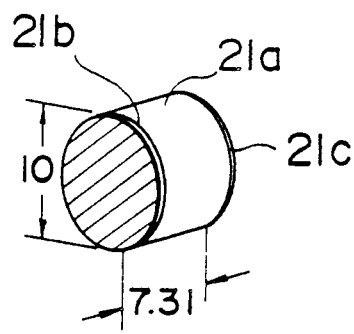
Figure 4C:
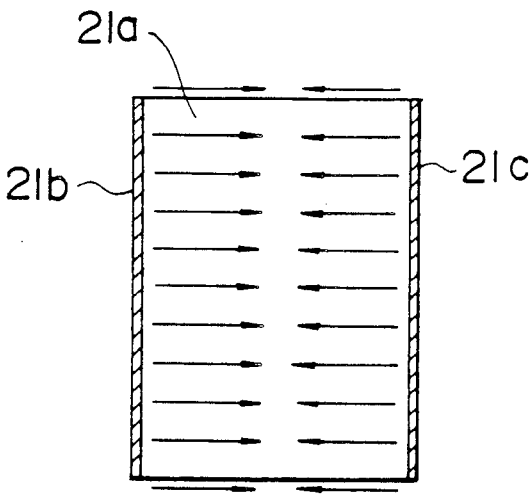
Figure 5A:
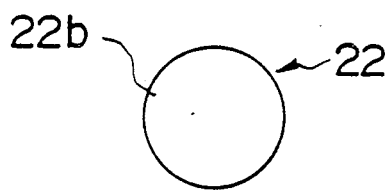
Figure 5B:
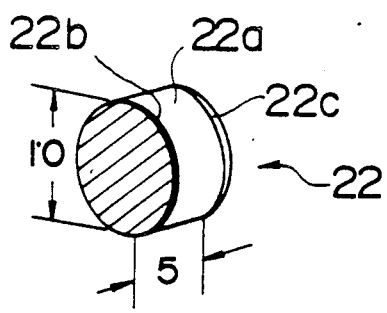
Figure 5C:
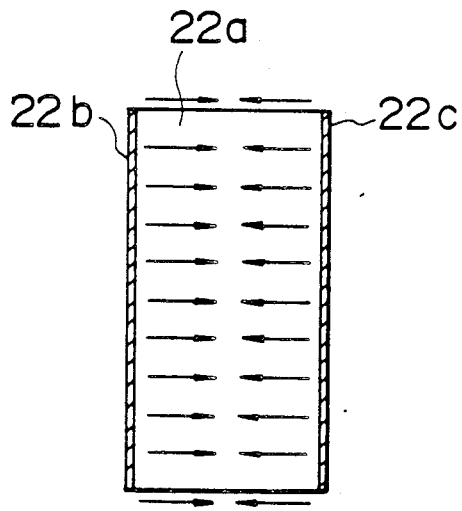

FIG. 4A is a side view of the cylindrical piezoelectric vibrator comprising a cylindrical piezoelectric ceramic body 21 provided with electrodes 21b and 21c; FIG. 4B is a perspective view of the vibrator 21; and FIG. 4C is a drawing indicating the vibration displacement on the cylindrical side surface of the vibrator 21. FIGS. 5A–5C are similar drawings to the foregoing except that D=10 mm and l=5 mm.

As is clearly understandable from FIG. 3, the strong vibration displacement in one direction is produced in the vibrator having the same values of the diameter D and the length l. The vibration displacement in the circumference direction is small on the portion where the vibration displacement in the longitudinal direction is large, while the vibration displacement in the circumference direction is large on the portion where the vibration displacement in the longitudinal direction is small.

The present invention realizes various kinds of embodiments on the basis of the foregoing characteristics of the cylindrical piezoelectric ceramic vibrator. More specifically, for example, the moving element is made in contact with the side surface where the longitudinal (axial) displacement is large in the cylindrical piezoelectric vibrator and the side surface where the longitudinal displacement is small is supported by the fixing portion, thereby realizing an effective actuator.

The roller is made to contact with the surface portion of the large displacement of the piezoelectric body and is also made to contact with the moving element to effectively convert the vibration displacement of the vibrator into the rotational force for transferring the moving element. Thus, an effective actuator is made possible by making the contact between the roller and the vibrator at a point or a line contact situation. Furthermore, the following applications to various kinds of apparatuses are realized.

Figure 8A:
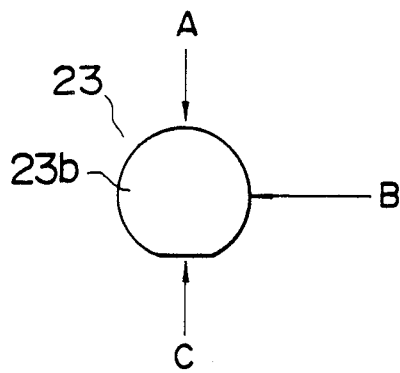
FIGS. 8A-8E show drawings representing shapes and displacements on the respective portions of the modified cylindrical vibrator according to the present invention.
Figure 8B:
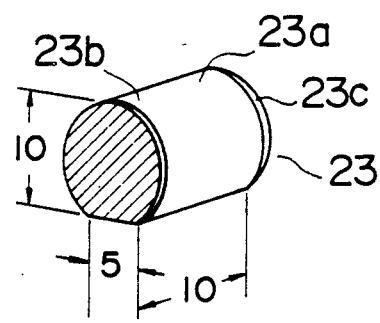
Figure 8C:
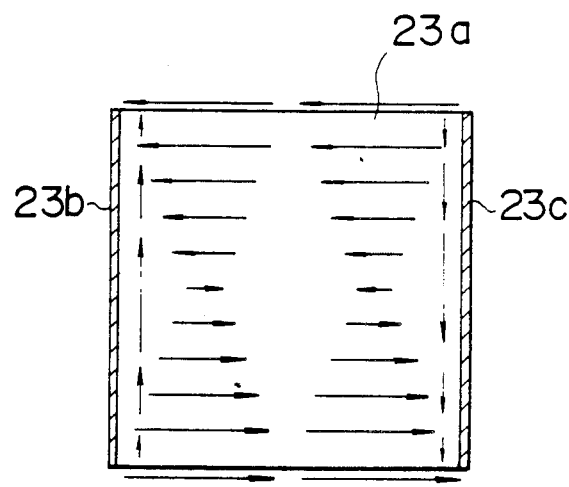
Figure 8D:
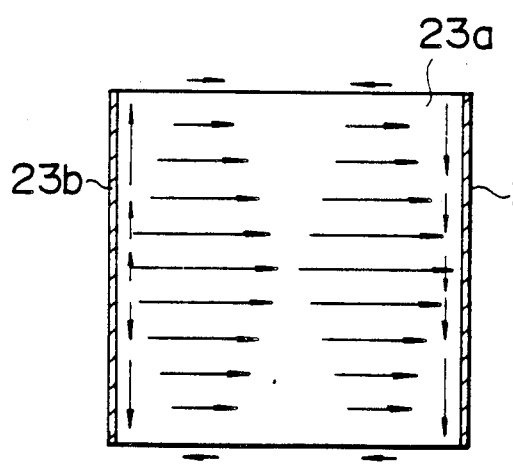
Figure 8E:
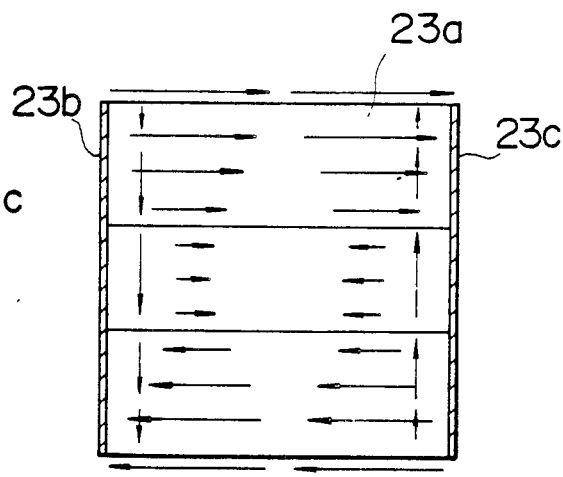

In FIGS. 8A-8E there are shown the structures and the vibration situation of a modified cylindrical vibrator in which a part of the side surface is cut off to form a plane surface parallel to the longitudinal axis. FIG. 8A represents a side view of the vibrator 23; FIG. 8B is a perspective view of the vibrator 23; and FIGS. 8C, 8D and 8E are drawings indicating the vibration displacements of the vibrator 23 viewed from the arrows A, B and C in FIG. 8A, respectively.

The vibrator 23 is the same as that shown in FIG. 3 except for that a part of the side surface is cut off. Clearly understandable from FIG. 8E, the longitudinal displacement is small on the flat surface formed by the cut off surface. Therefore, the vibrator may preferably be supported by the housing at the flat surface.

The same displacement is also observed on the two flat surfaces symmetrically formed with respect to the longitudinal direction.

The poling directions of the vibrator shown in FIGS. 3 to 5 and 8 are coincident with the longitudinal (length) direction of the vibrator (base line direction of the cylindrical piezoelectric body).

FIGS. 1A and 1B are a sectional view and a plan view of the first embodiment of the present invention.

The actuator in this embodiment comprises vibrators 1 and 2 operating as the stator, rotor 3, axis 4 around which rotor 3 is supported and freely rotable, spring 5 pressing rotor 3 against vibrators 1 and 2 with a predetermined contact pressure, vibrator support frames 6 and 7 respectively supporting vibrators 1 and 2 through sponge rubber plate 8, housing 20, bolts 9 and 10 for fixing vibrator support frames 6 and 7 to housing 20, and nuts 15 and 16 for fixing axis 4 to the housing 20. The rotor 3, corresponding to the moving element is driven by vibrators 1 and 2 and is rotated around axis 4.

The vibrators 1 and 2 are provided at the positions having the same distances from axis 4 or the rotation center of rotor 3. The vibrators 1 and 2 are made to contact with rotor 3 at the portion of the cylindrical side surface where the displacement in the longitudinal direction is the maximum and with rubber plate B at the portion where the longitudinal displacement is the minimum.

Figure 9:
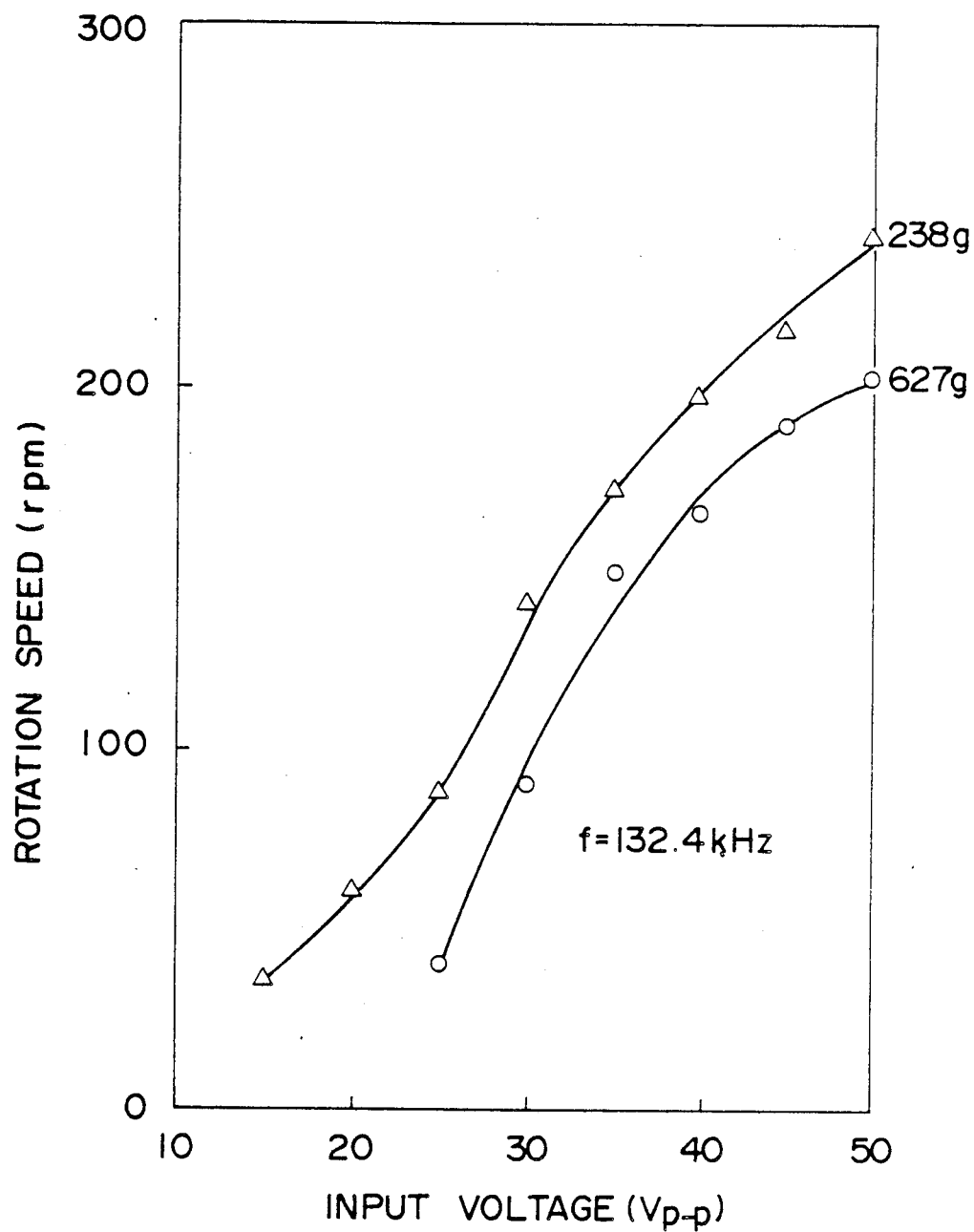
FIG. 9 shows a characteristic drawing representing a relationship between the input voltage and the rotor rotational speed of the embodiment shown in FIG. 1.

The vibrators 1 and 2 are made to contact with rotor 3 such that the direction of the displacement on the contact portion with rotor 3 is that shown in FIG. 1B. For example, when the side surface of vibrator 1 indicated by the arrow A in FIG. 3 is made to contact with rotor 3, the directions of the displacements of the vibrators 1 and 2 are put in order as shown in FIG. 1B by touching the surfaces of the vibrator 2 indicated by arrow A or C shown in FIG. 3A with rotor 3. The spring 5 presses rotor 3 against vibrator 2 using head portion 4a of axis 4 as the fulcrum. The pressure strength by spring 5 is arbitrarily adjustable by loosening nuts 15 and 16, moving axis 4 upward or downward, and then tightening nuts 15 and 16. FIG. 9 is a characteristic graph representing the relationship between the input voltage and the rotor rotational speed in the embodiment of FIG. 1 where rotor 3 is pressed against vibrators 1 and 2 with the contact pressures of 238 g and 627 g and the alternative voltage of 132.4 kHz is applied to the vibrators 1 and 2. It has been confirmed that rotor 3 is smoothly rotated at a high speed in this embodiment.

Figure 10:
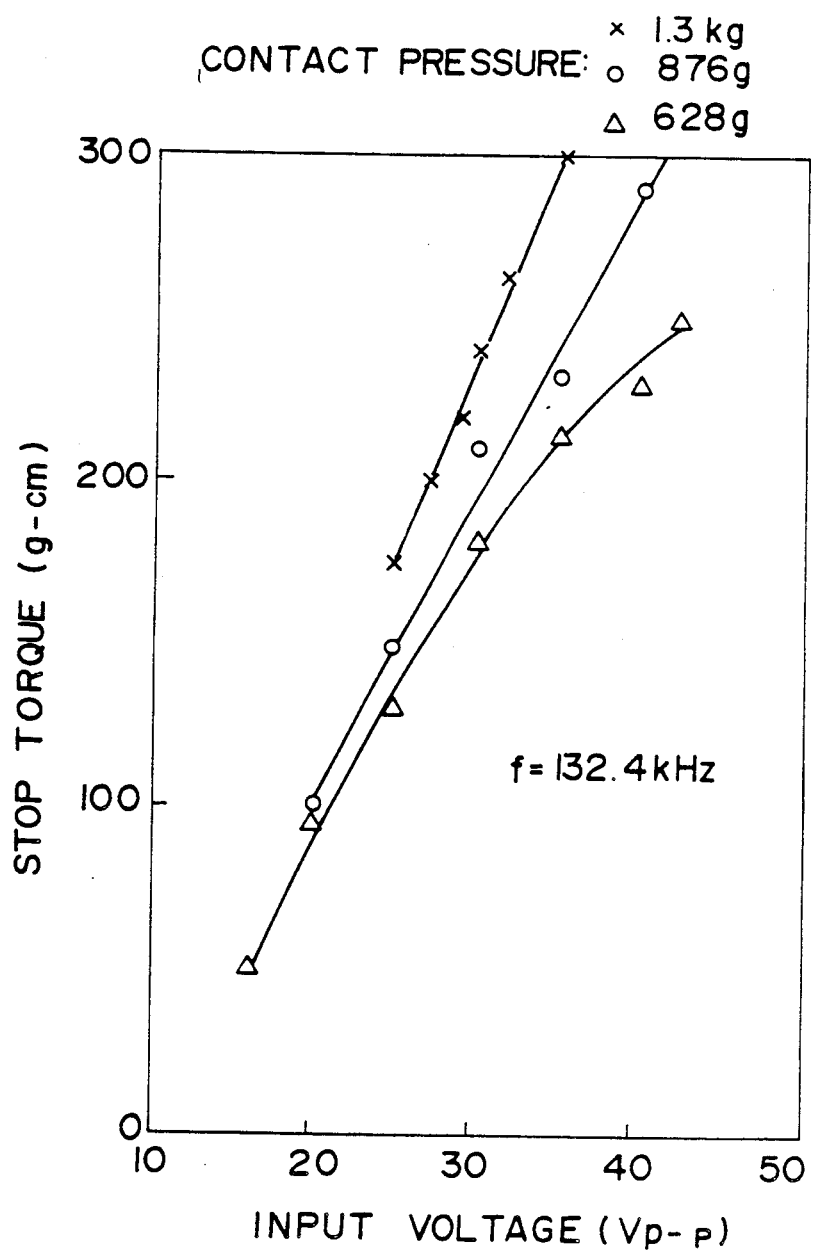
FIG. 10 shows a characteristic drawing representing a relationship between the input voltage and the stop torque necessary for stopping the rotor in the embodiment of FIG. 1.

FIG. 10 is a characteristic graph representing the relationship between the input voltage and the stop torque necessary for stopping the rotation with a parameter of the pressure strength of rotor 3 in the embodiment of FIG. 1. A relatively large stop torque of 300 g cm is obtainable when rotor 3 is pressed against vibrators 1 and 2 with the pressure 1.3 kg and the input voltage 35 Vp-p.

In the embodiment of FIG. 1, rotor 3 is continuously rotated by applying two alternative voltages of the frequency f having opposite polarities to the vibrators 1 and 2.

Figure 11:
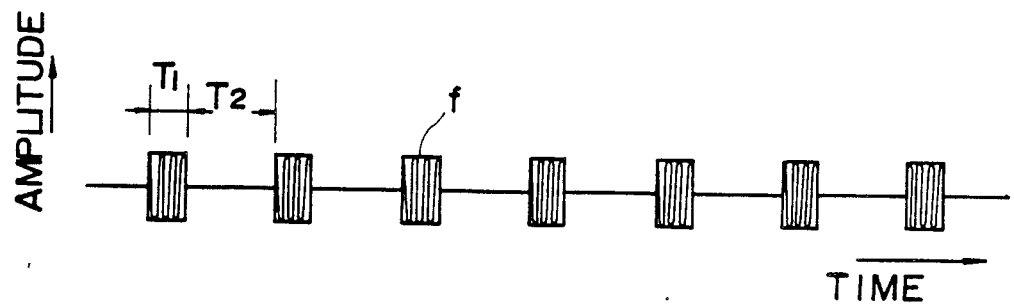
FIG. 11 shows exemplified waveforms of the pulsed intermitted rf burst alternative voltage.

On the other hand, when the alternative voltage of the frequency f1 is applied during the time period T1 and not applied during the next time period T2 as shown in FIG. 11, rotor 3 is intermittently rotated. This means that the embodiment of FIG. 1 may be operated as a stepping motor. The rotation angle of rotor 3 is proportional to the number of the carrier wave of the alternative voltage in one burst, i.e., to the time period T1 of one burst.

It is to be noted that the present invention is also applicable to the structure that rotor 3 is fixed to axis 4 which is supported and is freely rotatable by housing 20. When axis 4 is rotated together with rotor 3, axis 4, is preferably supported by housing 20 through bearings. Although rotor 3 is pressed against vibrators 1 and 2 by spring 5, the spring is not necessarily required in the present invention. A concentric circular plane weight provided on rotor 3 and a spring provided under vibrators 1 and 2 for pressing them against rotor 3 may be employed instead thereof.

Figure 6A:
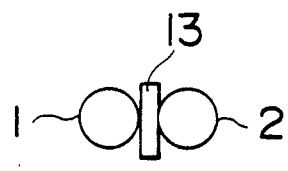
FIGS. 6A-6C show a plan view, a front view and a side view of the main portion representing another embodiment according to the present invention.
Figure 6B:
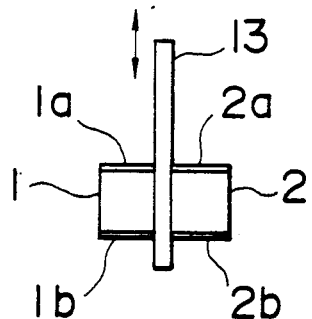
Figure 6C:
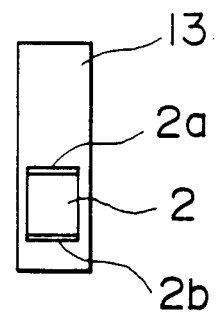

FIGS. 6A, 6B and 6C show a plan view, a front view and a side view of another embodiment according to the present invention. In this embodiment, moving element 13 is held between vibrators 1 and 2. The moving element 13 is moved in the upward and downward directions shown by the arrow in FIG. 6B by supplying an in-phase driving signal to vibrators 1 and 2. This structure may produce a larger torque. To press vibrators 1 and 2 against moving element 13 an elastic material such as the spring shown in FIG. 1 is used.

Figure 7:
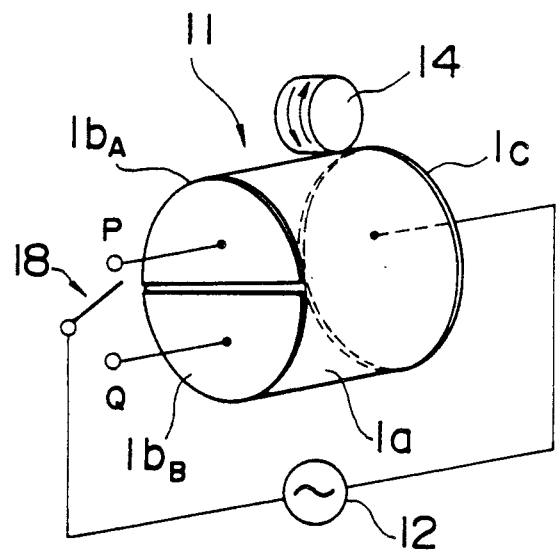
FIG. 7 shows a construction of another embodiment according to the present invention.

In FIG. 7 there is shown one exemplified structure for arbitrarily controlling the vibration direction of the vibrator. In this embodiment, the electrode formed on one end surface of the vibrator is electrically separated into two electrodes $1b_A$ and $1b_B$. The two electrodes are respectively provided with input terminals P and Q and the driving signal from an alternative power source 12 is supplied to the terminal P or Q through a switch 18. Accordingly, the displacement directions of vibrator 11 are opposite for the applications of an ac voltage to electrode $1b_A$ through terminal P and to electrode $1b_B$ through terminal Q. The rotor 14 is pressed against the cylindrical side surface of vibrator 11 and is rotated in the displacement direction of vibrator 11 on the contact portion. As a result, the rotation direction of rotor 14 is arbitrarily selectable by the position of switch 18. It is to be noted here that one of paired electrodes $1b_A$ and $1b_B$ may be removed or an electrode can be formed on a part of one end surface of the vibrator 11 to specify the surface of a large and a small vibration displacements. In other words, the vibration situation may be specified by asymmetrical formation of the electrode.

As described above in detail, according to the present invention it becomes possible to provide a vibrator-type actuator having a simplified mechanical structure and driving circuit for the piezoelectric vibrator operable with a single-phase ac voltage.

Figure 12A:
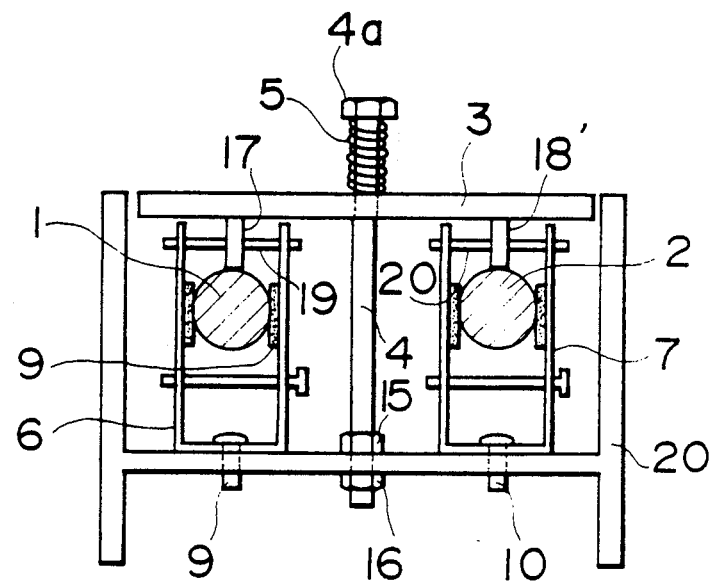
FIGS. 12A and 12B respectively show a sectional plan view and a plan view representing another embodiment according to the present invention.
Figure 12B:
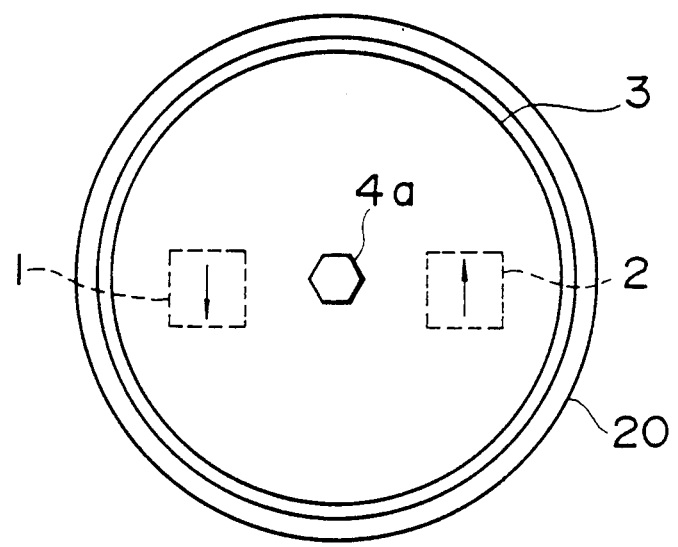

FIGS. 12A and 12B show a sectional view and a plan view of another embodiment according to the present invention. The structure of this embodiment is essentially the same as that in FIGS. 1A and 1B. The difference is that the rotational driving torque is, given to the disk (rotor) through rollers 17 and 18 not directly from the vibrator. The supply of the driving force to vibrators 1 and 2 and the control of the rotational direction are performed in the same way as that of FIG. 1.

Figure 13A:
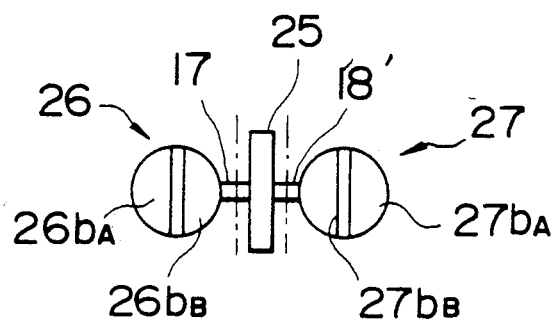
FIGS. 13A-13C show a modified example of the embodiment shown in FIGS. 12A and 12B.
Figure 13B:
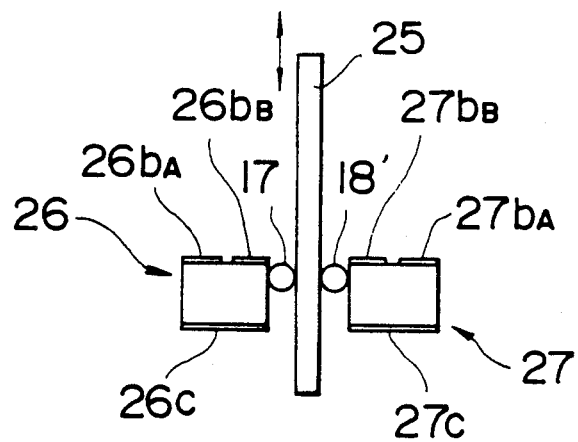
Figure 13C:
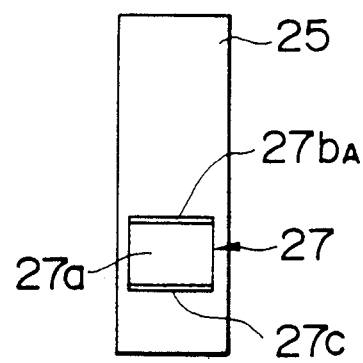
Figure 14A:
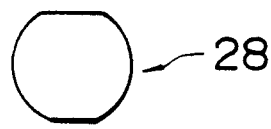
FIGS. 14A-14C show one example of a shape of the vibrator used in the present invention.
Figure 14B:
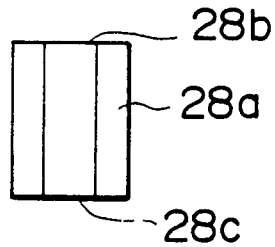
Figure 14C:
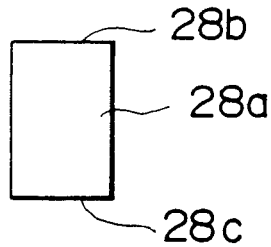

In the embodiment of FIGS. 13A–13C, moving element 25 is supported by vibrators 26 and 27 through rollers 17 and 18 and moving element 25 is moved in the arrow direction by switching the supply of the driving signal to separated electrodes $26b_A$, $26b_B$.

In the embodiment the roller is made to contact with the vibrator at a point-like area. Therefore, the direction of the vibration displacement of the vibrator at the contact portion is completely coincident with the rotational direction of the roller and there is little friction based upon the speed difference between the vibrator and the roller.

The present invention may employ the vibrator in which a small vibration displacement in the specified direction is produced only on a small area since the contact area between the vibrator and the roller is extremely small. For example, in the embodiment of FIG. 13 the vibrator having a size in FIG. 4 and vibrator 22 having a thickness of 5 mm in FIG. 5 may be employed.

Consequently, the miniaturization of the vibrator-type actuator according to the present invention becomes easier as compared to the conventional vibrator-type actuator.

In the above-described embodiment, the roller is directly made to contact with the piezoelectric body of the vibrator. A thin metal plate may be formed on the surface of the piezoelectric body with which the roller is made to contact with and the vibrator may be made to contact with the roller through the metal plate. Since the vibration displacement is caused even on the metal plate formed on a part of the surface of the piezoelectric body, the roller may also be rotated in the same way as that without the metal plate and the abrasion of the piezoelectric body may be prevented.

Furthermore, the roller for converting the vibration displacement of the vibrator into rotational movement is made to contact with the vibrator at the outer end circumference and the rotational axis of the roller is parallel to the poling axis of the vibrator. Therefore, the contact area between the vibrator and the roller is extremely small and there is little differences in magnitudes and directions between the two speeds at the contact surface, thereby reducing the abrasions of the vibrator and the roller.

It is clearly understandable that the pillar-shaped vibrator may be applied to the present invention.

Figure 15:
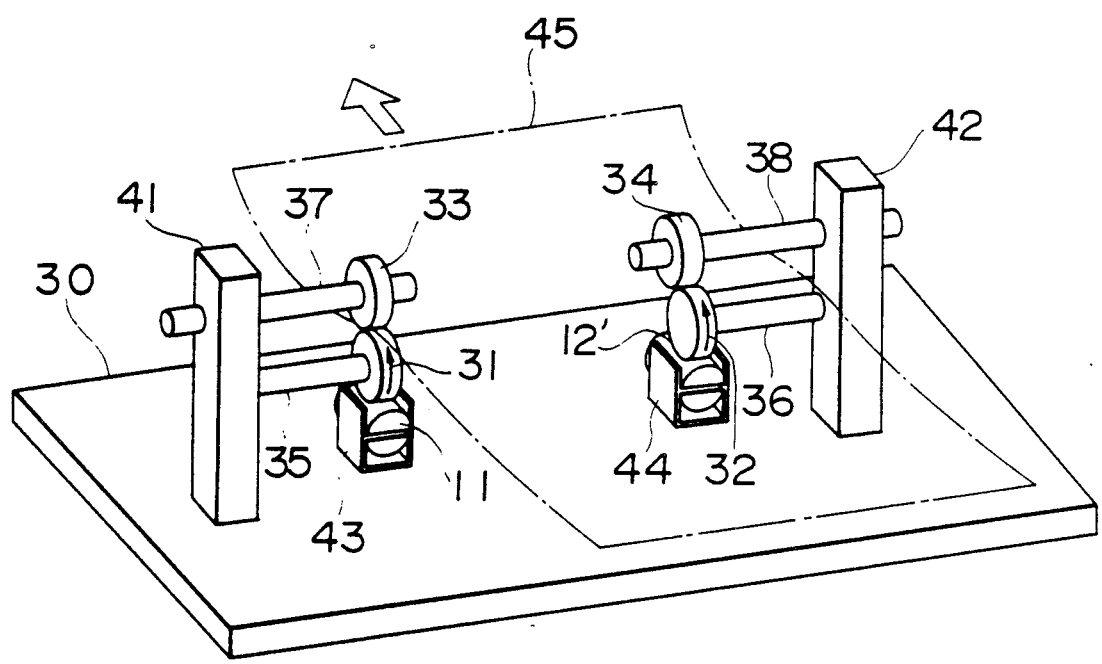
FIG. 15 shows a perspective view of the paper feed apparatus according to the present invention.

FIG. 15 shows a perspective view of the paper feed apparatus embodiment, according to the present invention, comprising cylindrical piezoelectric vibrators 11, 12', an aluminum table 30, metal rollers 31–34, axes 35–38, supporting poles 41, 42 and vibrator supporting frames 43, 44. The diameters of cylindrical piezoelectric vibrators 11, 12', rollers 31, 32 and rollers 33, 34 are 10 mm, 19 mm and 23 mm, respectively.

The supply of the driving signal to vibrators 11 and 12' is performed by the system as shown in FIG. 7.

More specifically, one electrode of the paired electrodes of vibrator 11 is electrically separated into two electrodes $1b_A$ and $1b_B$. One terminal of ac power source 12 is connected to electrode 1C and another terminal thereof is switchably connected with electrodes $1b_A$ and $1b_A$ through switch 18. The vibration displacement on vibrator 11 is reversed by moving the switch from terminal P to Q or terminal Q to P. The vibrator 12' has the same structure as vibrator 11. The switches 18 of vibrators 11, 12' are synchronously controlled with one another.

The supporting poles 41, 42 and vibrator supporting frames 43, 44 are fixed to table 30. The vibrator supporting frames 43, 44 support vibrators 11, 12' by holding the portions thereof where the displacements are minimum. To the supporting poles 41 and 42, axes 35, 37 and 36, 38 are fixed, respectively. The rollers 31, and 32 are provided to axes 35 and 37 through bearings so as to be freely rotatable and rollers 32 and 34 are provided to axes 36 and 38 through bearing so as to be freely rotatable.

The rollers 31 and 32 are pressed against the surface portion of vibrators 11 and 12' where the displacement is maximum with a predetermined static pressure. When the alternative voltages are applied to vibrators 11 and 12', rollers 31 and 32 are given a force in the circumference direction or a rotational force from the vibrators 11 and 12' and are thus rotated.

The gaps between rollers 31 and 33 and rollers 32 and 34 are a little thinner than the thickness of the paper. Upon contact of the front edge 45a of the paper 45 with the gap portion of the roller driving the rotation of rollers 31 and 32 in the arrow direction, paper 45 is held by rollers 31, 33 and 32, 34 and is fed toward the arrow direction.

The paper 45 suddenly stops when switch 18 is moved to neutral terminal N during feeding of paper 45, by supplying ac voltage to electrode $1b_A$ through switch 18 and terminal P. On the other hand, paper 45 is fed in the reverse direction when ac voltage is supplied to electrode $1b_B$ through terminal Q.

Figure 16:
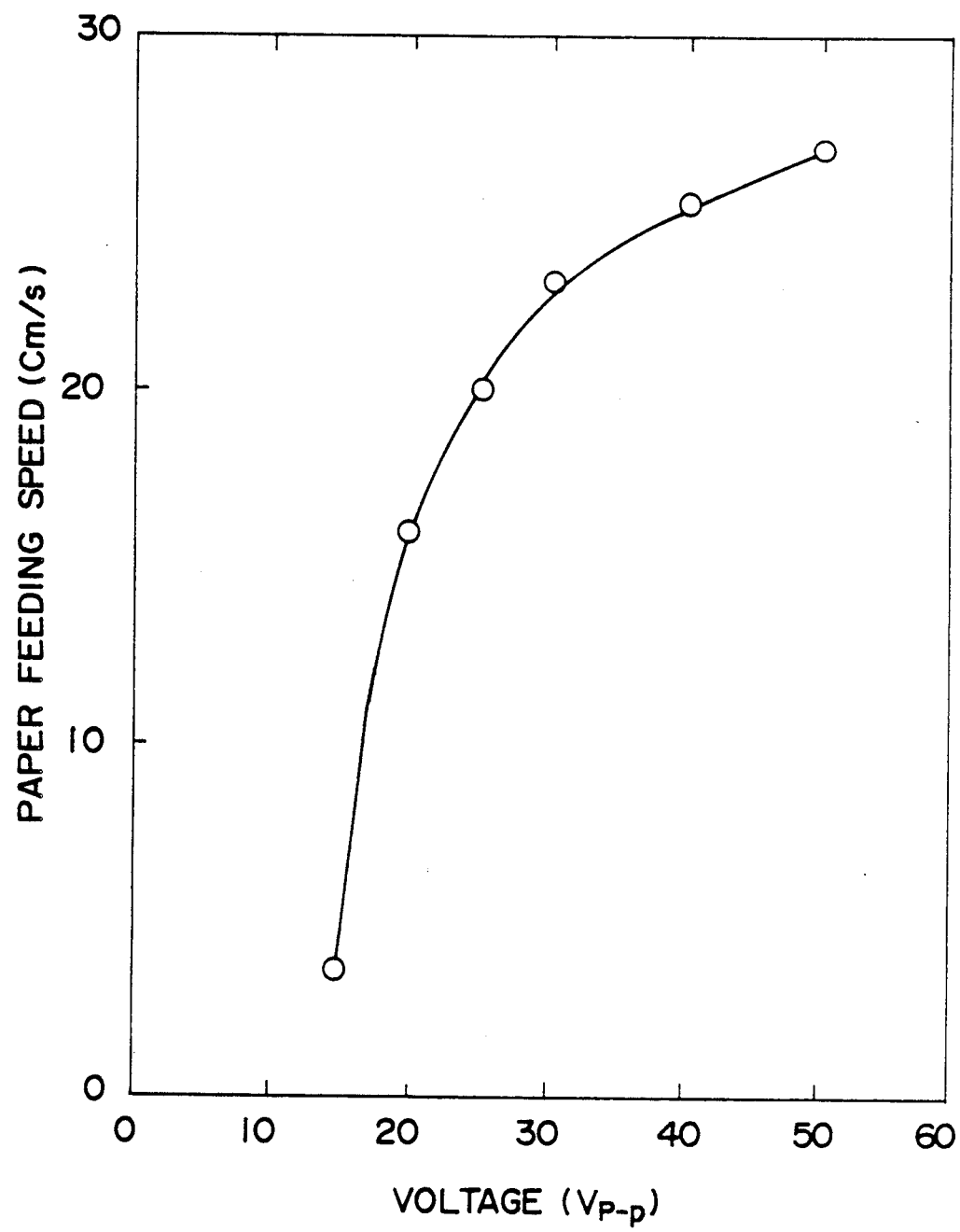
FIG. 16 shows a drawing representing the paper feed speed characteristic of the embodiment shown in FIG. 15.

FIG. 16 is a drawing indicating the paper feed characteristic of the embodiment shown in FIG. 15. As shown in the drawing, according to this embodiment, the paper feeding speed may be controlled in a wide range only by changing the voltage to be applied to the vibrator. The paper may be fed in forward and backward directions by using piezoelectric vibrators 11 and 12' as the driving means without employing the electromagnetic motor, thereby simplifying the structure. This embodiment, therefore, has advantages in miniaturization and cost.

In the embodiment of FIG. 15, rollers 31 and 32 are given the rotational force based upon the displacement of the vibrator and may be replaced with one wide cylinder. Namely, although two roller pairs (31, 33 and 32, 34) holding and feeding paper 45 are used in the embodiment, one pair, three or more pairs of the wide cylinders may be used if each roller pair is given the rotational force by the piezoelectric vibrator. The vibrator separated as shown in FIG. 3 is used in this embodiment. Since the piezoelectric vibrator is made to contact with the first roller (corresponding to roller 31 or 32) at a point or line-like area and the displacement is transmitted to the paper through the first roller, the vibrators shown in FIGS. 4 and 5 having the opposite vibration displacement directions depending upon the portion may be used. Therefore, the present invention may use a small-sized vibrator.

As the vibrator, a square pole or other pillar shapes may be used as well as the cylindrical piezoelectric vibrator.

Figure 17:
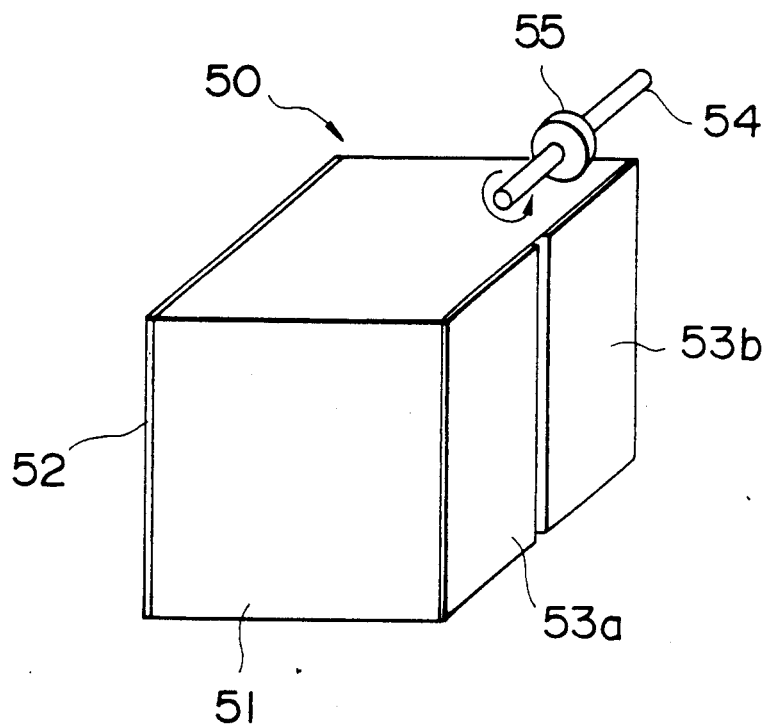
FIG. 17 shows a perspective view of another embodiment according to the present invention.

Furthermore, a thin metal plate may be formed on the surface of the piezoelectric body with which the first roller is made to contact. Thus, the displacement is transmitted to the first roller through the thin metal plate for avoiding the abrasion of the piezoelectric body. FIG. 17 is a perspective view of another embodiment according to the present invention which is directed to an improvement in equipment structure using a square pillar-shaped piezoelectric vibrator.

This embodiment comprises piezoelectric vibrator 50, rotor 55 and a pressing means (not shown) for pressing rotor 55 against piezoelectric vibrator 50. The piezoelectric vibrator 50 includes ceramic piezoelectric body 51 and electrodes 52, 53a, 53b. The rotor 55 is provided with a rotational axis 54. The electrodes 53a and 53b are electrically isolated. The piezoelectric body 51 is a cube shape having a side length of 5 mm. The material constant of piezoelectric body 51 are Young's modulus $Y_{33}^E = 7.7 \times 10^{10}$ (N/m$^2$), a density $\rho = 7.6 \times 10^3$ (kg/m$^2$) and a Poisson's ration $\sigma = 0.28$. The poling axis of the piezoelectric body 51 is in the direction perpendicular to electrodes 52, 53a and 53b.

Figure 18:
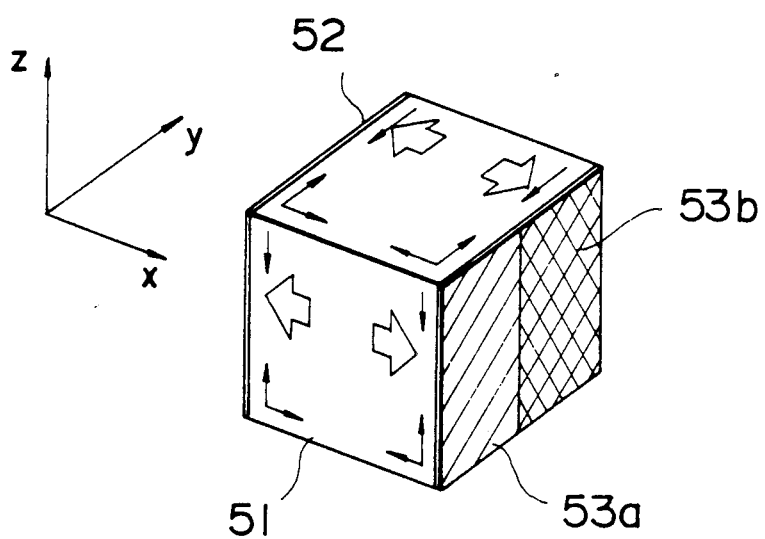
FIG. 18 shows a drawing representing the vibration displacement of the piezoelectric vibrator in the embodiment shown in FIG. 17.

FIG. 18 is a schematical drawing representing the vibration displacements on the surfaces of piezoelectric body 51 by arrows in the embodiment. The vibration displacements in the X and Y axes are produced in the opposite directions of that in FIG. 18 when the alternative voltage is applied between the electrodes 52 and 53b. Here, the vibration displacement in the Y axis direction is still the same direction of FIG. 18 even if the electrode to which the voltage is applied is changed from the electrode 53a to the electrode 53b.

Figure 19:
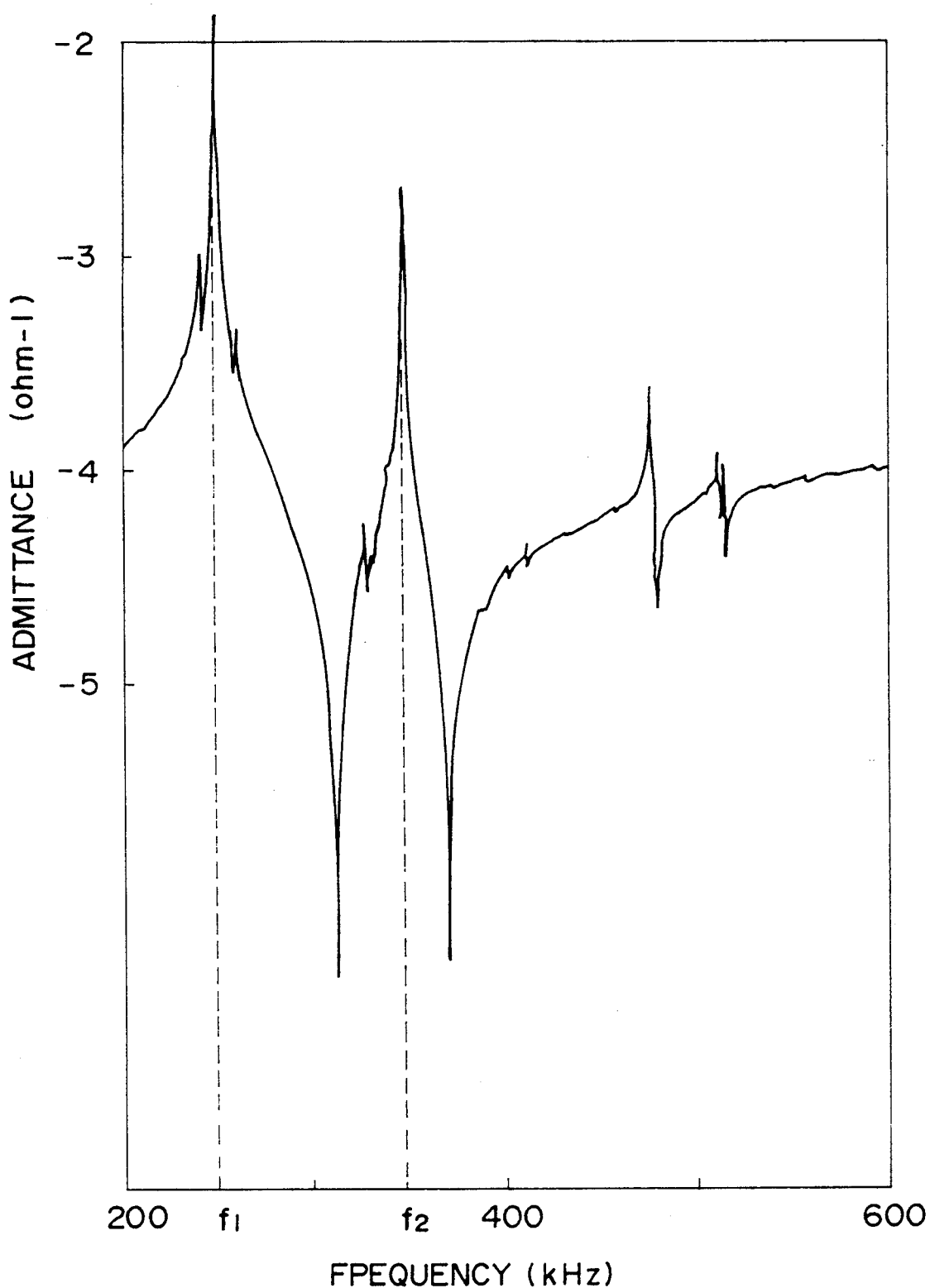
FIG. 19 shows a characteristic drawing representing the relationship between the frequency and the admittance of the piezoelectric vibrator in the embodiment shown in FIG. 17.

In FIG. 19, there is shown a frequency characteristic of the admittance of the piezoelectric vibrator when ac voltages of 200-600 kHz are applied to piezoelectric vibrator 50 in the embodiment of FIG. 17. From this drawing it is understandable that piezoelectric vibrator 50 resonances at frequencies f1, f2 and f3 where large vibration displacements appear. The f1 is 233.2 kHz in this embodiment. The excitation of piezoelectric vibrator 50 by this frequency causes the vibration displacements shown by the arrows in FIG. 18.

The embodiment of FIG. 17 is directed to the actuator which picks up the vibration displacement in FIG. 18 as the rotational force. The rotor 55 is rotated around rotational axis 54 in the arrow direction of FIG. 17. The rotational direction of rotor 55 may be controlled by changing the supply of the ac voltage from electrode 53a to 53b.

In FIG. 17, rotor 55 is stably pressed against piezoelectric body 51 by a well-known means such as a spring.

This embodiment is applicable to a cash dispenser in banks by pressing rotor 55 against the card. As rotor 55 hard materials such as hard plastic and metals are suitable. However, hard material sometimes damages the card. In order to avoid such damages a second rotor made of rubber is usable. The rotation force of rotor 55 is transmitted to the second roller and the second roller is pressed against the card.

In this embodiment, the rotation direction of rotor 55 may be arbitrarily controlled by switching the electrode to which a single-phase ac voltage is applied from 53a to 53b or 53b to 53a, thereby simplifying the driving circuit of the piezoelectric vibrator.

Figure 20:
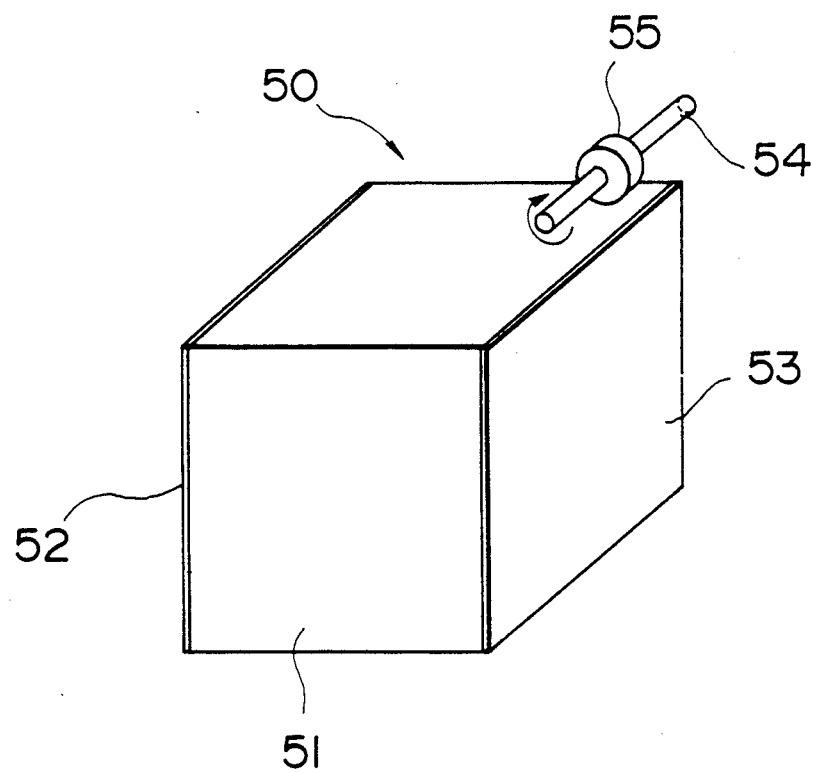
FIG. 20 shows a perspective view of the modified embodiment of FIG. 17.

FIG. 20 represents an embodiment in which the electrodes 53a and 53b are not separated.

Figure 21A:
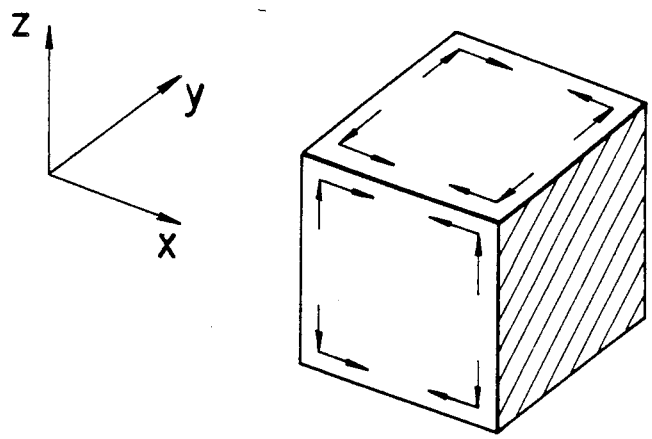
FIGS. 21A and 21B show drawings representing the vibration displacements of the piezoelectric vibrator, at two resonance frequencies, shown in FIG. 20.
Figure 21B:
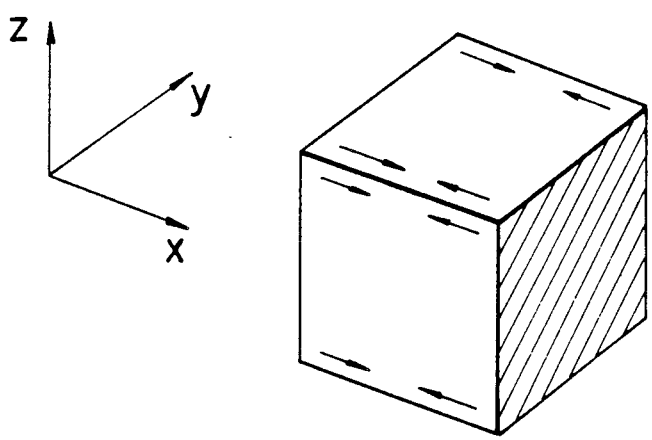

FIGS. 21A and 21B show the vibration displacements by arrows appearing on the surfaces of the piezoelectric body 51 when ac voltages of frequencies 248.2 kHz and 348.2 kHz are applied between electrodes 52 and 53 of the embodiment in FIG. 20.

Figure 22:
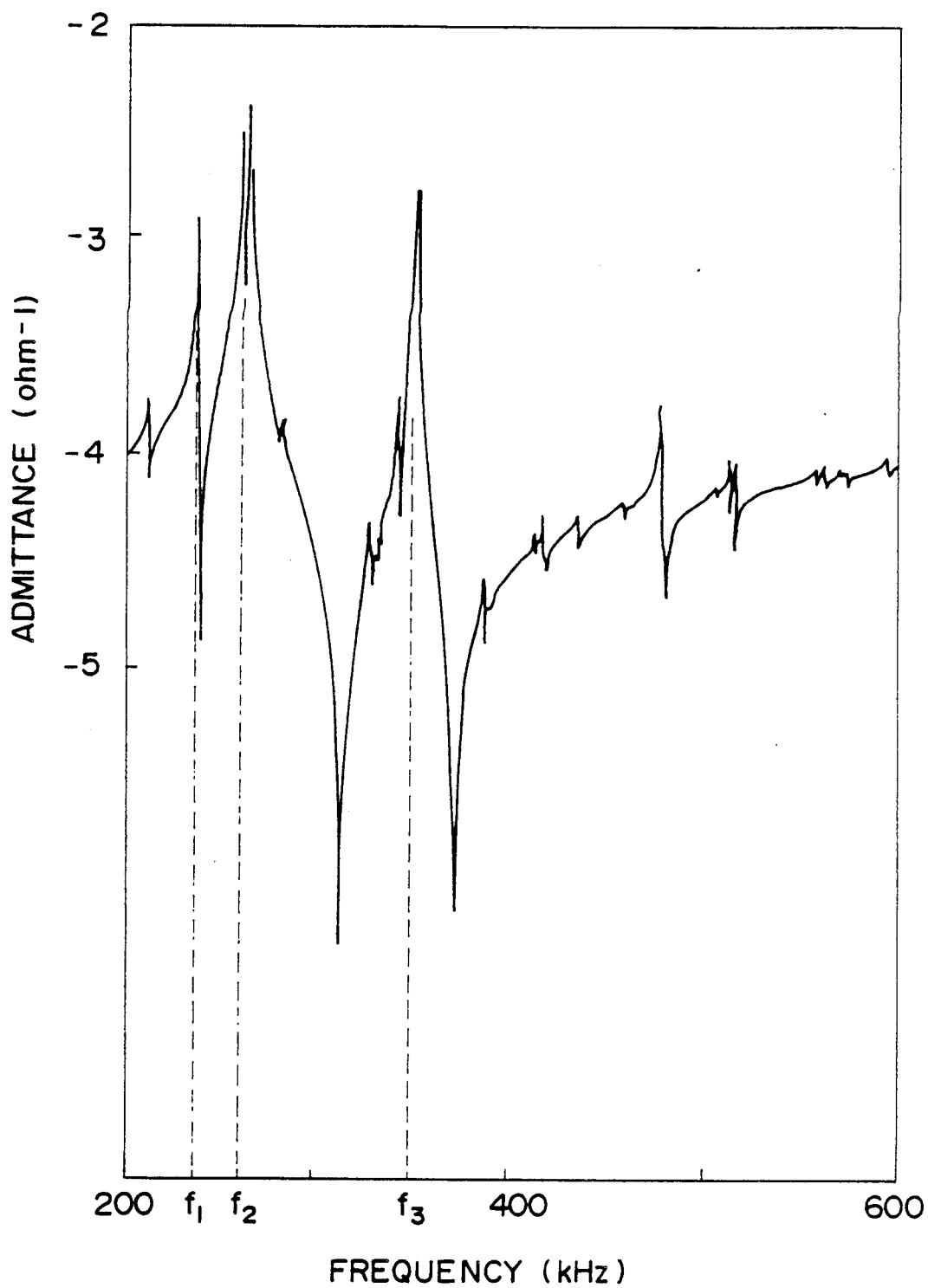
FIG. 22 is a characteristic drawing representing the relationship between the frequency and the admittance of the piezoelectric vibrator in the embodiment shown in FIG. 20.

FIG. 22 is a frequency characteristic of the admittance of the piezoelectric vibrator when ac voltages of frequencies 200-600 kHz are applied to the piezoelectric vibrator 50 of the embodiment in FIG. 20. The piezoelectric vibrator 50 resonates at frequencies f1 and f2 and large vibration displacements appear thereon. The frequencies f1 and f2 are 248.2 kHz and 348.2 kHz, respectively. The excitation of piezoelectric vibrator 50 by these frequencies cause vibrator displacements indicated by the arrows in FIG. 21, as described before.

The embodiment of FIG. 20 is the actuator which picks up the vibration displacement of FIG. 21 as the rotational force and rotates rotor 55 around rotational axis 54 in the arrow direction of FIG. 20.

Figure 23:
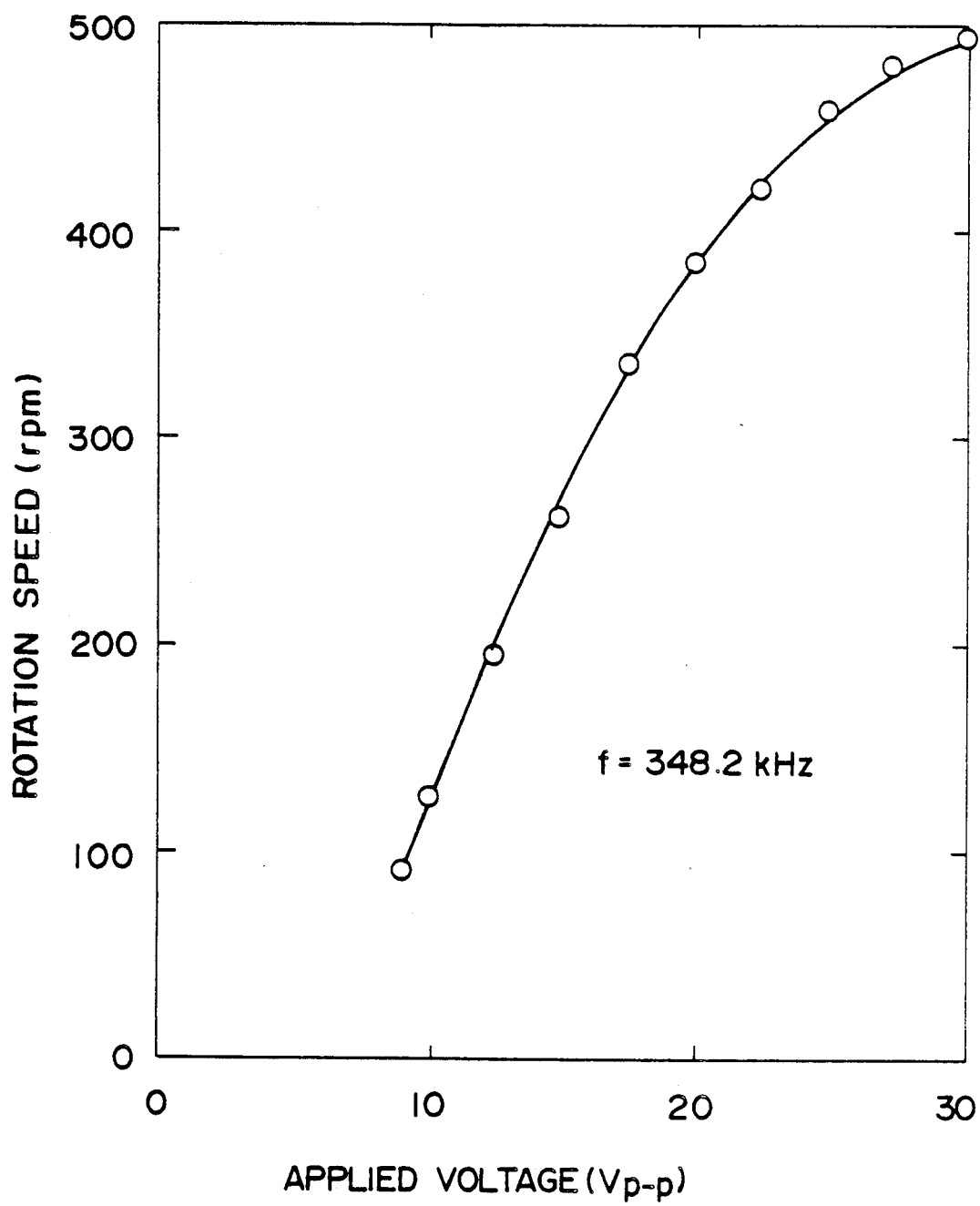
FIG. 23 is a drawing representing the relationship between the applied voltage and the rotor rotational speed in the embodiment shown in FIG. 20.

In FIG. 23, there is shown a relationship between applied voltage and rotational speed when the alternative voltage of a frequency 348.2 kHz is applied to piezoelectric vibrator 50 of FIG. 20. The graph indicates that the rotational speed of rotor 55 may be controlled in a wide range.

The next embodiment to be described relates to a moving apparatus including a piezoelectric vibrator guided by a rail.

In this embodiment the piezoelectric vibrator has a cylindrical shape and produces vibration displacement on the side surface which is pressed against the rail inner surface. The piezoelectric vibrator moves along the rail based upon the reaction from the rail. The moving direction is determined depending upon the applied voltage to the electrode of the piezoelectric vibrator.

Figure 25:
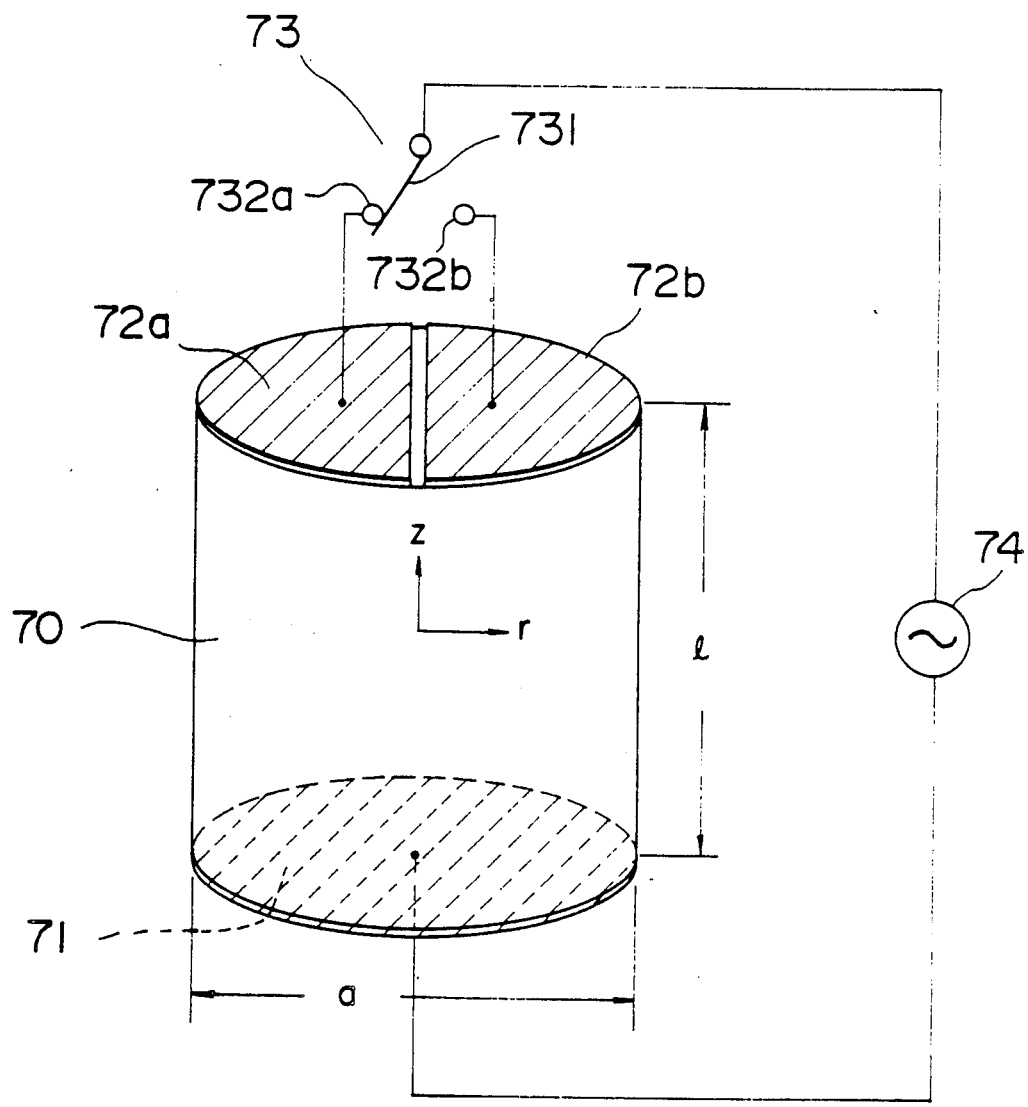
FIG. 25 shows a construction of the piezoelectric vibrator and a driving circuit utilized in the present invention.

FIG. 25 shows piezoelectric vibrator 70 and a driving circuit for driving piezoelectric vibrator 70 by applying single-phase ac voltage. The driving circuit comprises a switch 73 and single-phase alternative power source 74. The piezoelectric vibrator 70 has a cylindrical shape and electrodes 71, 72a and 72b. The electrode 71 is formed on one base surface. The electrodes 72a and 72b are formed on another base surface and are electrically separated by, for example, an etching technique. The switch 73 includes contacts 732a and 732b and alternately applies ac voltage from power source 74 to electrode 72a or 72b.

Upon application of ac voltage between electrodes 71 and 72a (or 72b) for driving piezoelectric vibrator 70, the wave motion or the vibration displacement appears on the side surface. The directions of the wave motions are the axis direction (z direction) and the radial direction (r direction) which are perpendicular to each other.

Now, it is to be assumed that the phases of the wave motions in the z and r directions are opposite and the expansion in the z direction is caused when the compression is caused in the r direction.

The displacements Uz and Ur at an arbitrarily selected mass point in the z and r directions are expressed as:

$$U_z = U_{zo} \cdot \cos \omega t \tag{9}$$

$$U_r = U_{ro} \cdot \cos (\omega t - \phi) \tag{10}$$

where Uzo, Uro represent amplitudes of the displacements, and represent an angular frequency and a phase difference between the vibration displacements in the z and r directions.

The displacement amplitudes in the cylindrical vibrator are expressed by:

$$U_{zo} = A \sin(K_z Z)$$

$$U_{ro} = B J_1 (k_r r)$$

where
A,B: constants
$K_z$, $K_r$: wave numbers
$J_1$: Bessel function of the first order.
When the phase $\phi$ is 90, the locus of the mass point is expressed by $$\frac{U_z^2}{U_{zo}^2} + \frac{U_r^2}{U_{ro}^2} = 1 \quad (11)$$

indicating elliptic motion. It is well-known that the locus of the mass point becomes elliptical.

In this embodiment, the ac voltage is applied to one of the separated electrodes 72a and 72b formed on the end surface of the cylindrical ceramic in an asymmetrical situation to determine the direction of the elliptical motion on the surface thereof.

Figure 26A:
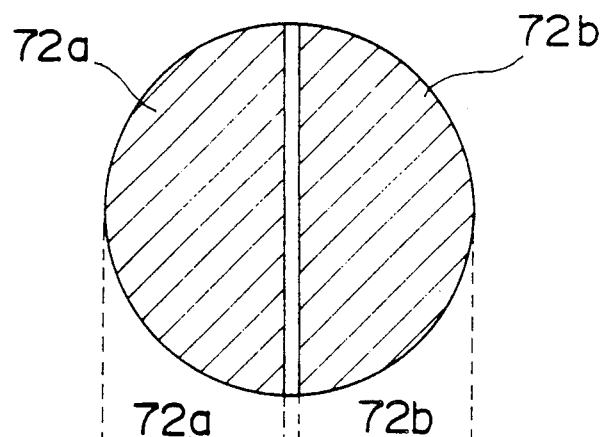
FIGS. 26A-26C show drawings representing vibration modes appearing on the cylindrical side of the piezoelectric vibrator of FIG. 25.
Figure 26B:
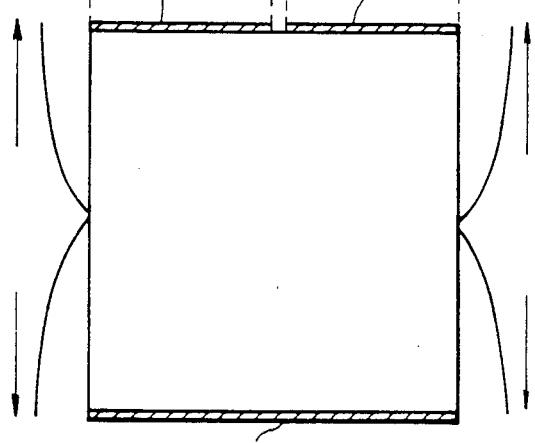
Figure 26C:
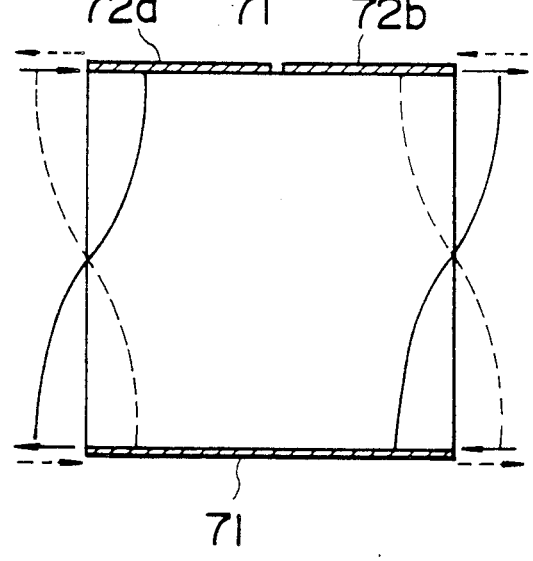

FIGS. 26A-26C show vibration modes appearing on the side surfaces of piezoelectric vibrator 70 in FIG. 25. FIG. 26A is a side view of piezoelectric vibrator 70 where separated electrodes 72a and 72b are formed; FIG. 26B is a schematical view representing the vibration mode in the axial direction; and FIG. 26C is a schematical vibration mode in the radial direction which is asymmetric with respect to the axial direction. In FIG. 26C, the broken lines indicate the vibration modes when ac voltage is applied to electrode 72a and solid lines indicate the vibration mode when ac voltage is applied to the electrode 72b. As described above, since the axial direction vibration (longitudinal vibration) and radial direction vibration are produced by opposite phase signals, and the radial direction vibration is asymmetric with respect to the axis as shown in FIG. 26C, it is possible to produce the wave moving only in one direction on each part of the cylindrical side surface of piezoelectric vibrator 70. The directions of the displacements (wave directions) due to the elliptical motion on the axially symmetrical positions of vibrator 70 are opposite one another. The direction of the vibration displacement may be reversed by changing the electrode to which the ac voltage is applied, i.e., by switching the moving contact 731 to the fixed contact 732a or 732b.

Figure 27:
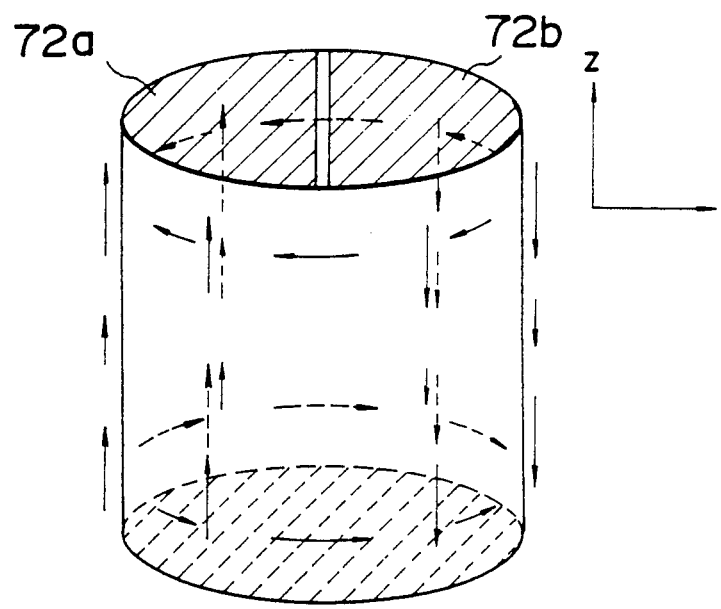
FIG. 27 shows a drawing representing a distribution of the vibration displacement on the cylindrical side surface of the piezoelectric vibrator shown in FIG. 25.

FIG. 27 represents the distribution of the vibration displacement on the cylindrical side surface of piezoelectric vibrator 70 in FIG. 25. In the drawing, the length of the arrow corresponds to the amplitude of the displacement, the solid line arrow indicates the vibration displacement on the front surface and the broken line arrow indicates the vibration displacement on the back surface. The displacement in the circumference direction is small on the portion where the displacement in the axial direction is large, while the circumferential displacement is large on the portion where the axial displacement is small. For example, it is seen that the displacement in the z direction exists only on the left end surface and the displacement in the −z direction exists only on the right end surface.

In this embodiment, a large vibration displacement which appears in the z or −z direction, presses the piezoelectric vibrator against the rail, thereby moving the piezoelectric vibrator along the rail based upon its reaction. The direction of the vibration displacement, that is, the moving direction of the piezoelectric vibrator may also be reversed by switch operation.

Figure 24A:
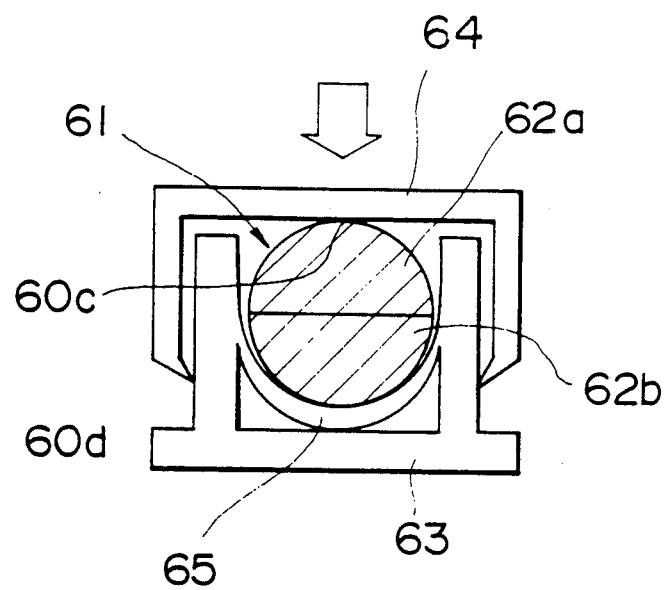
FIGS. 24A and 24B show a side sectional plan view and a partially cut-off side sectional plan view of the moving apparatus of the embodiment according to the present invention.
Figure 24B:
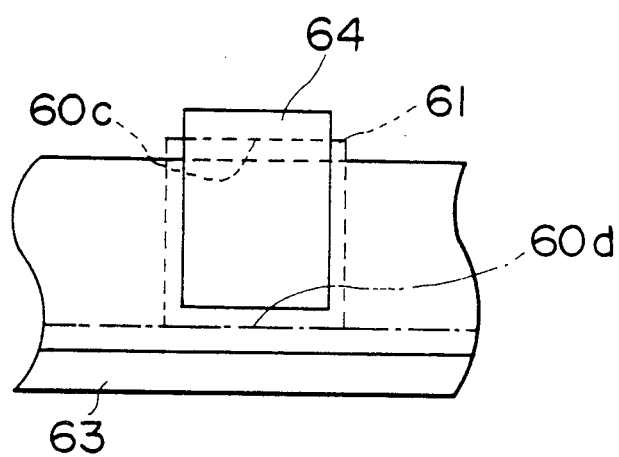

In FIGS. 24A and 24B, there are shown a lateral side sectional view and a partially cut-off side sectional view.

This embodiment comprises piezoelectric vibrator 61, rail 63 and slide frame 64. To the piezoelectric vibrator 61, ac voltage is supplied from single-phase ac power source 74 through switch 73. The piezoelectric vibrator 61 is moved along fixed rail 63. The switch 73 is provided on the base surface of piezoelectric vibrator 70, but is not shown in FIG. 24. The ac power source 74 applies single-phase ac voltage between switch 73 and electrode 71 by means of a flexible wire. The piezoelectric vibrator 61 is fixed to slide frame 64 at fixing surface 60C and is made to contact with the base of groove 65 of rail 63 at sliding surface 60d. The arbitrary movement of piezoelectric vibrator 61 in the longitudinal direction is made possible due to the reaction from the base surface of groove 65. The slide frame 64 slides together with piezoelectric vibrator 61. Two lower ends of slide frame 64 are made to contact with the outer surface of rail 63 so as to prevent the rotation around the axis of piezoelectric vibrator 61 in groove 65. An object may be provided on the upper surface of slide frame 64 and piezoelectric vibrator 61, or piezoelectric vibrator 61 may be used as the action element. This embodiment is applicable to various industrial fields such as a work moving apparatus in an FMS and various dr sources in automatic machines (i.e., industrial robots).

The piezoelectric vibrator 61 used in the embodiment of FIG. 24 is shown in FIGS. 25-27, being 10 mm in diameter and 10 mm in length, and is polarized in the axial direction. The resonance frequency Qm and admittance of piezoelectric vibrator 61 are 127.7 kHz, 211 and 0.64 ms, respectively. As is seen from FIGS. 24 and 27, the axial vibration displacement is maximum on the contact portion (slide surface 60d) of piezoelectric vibrator 61 and rail 63. The direction of the vibration displacement may be reversed by switch 73 and the moving direction of piezoelectric vibrator 61 may arbitrarily be selectable by appropriately setting switch 73.

Figure 28:
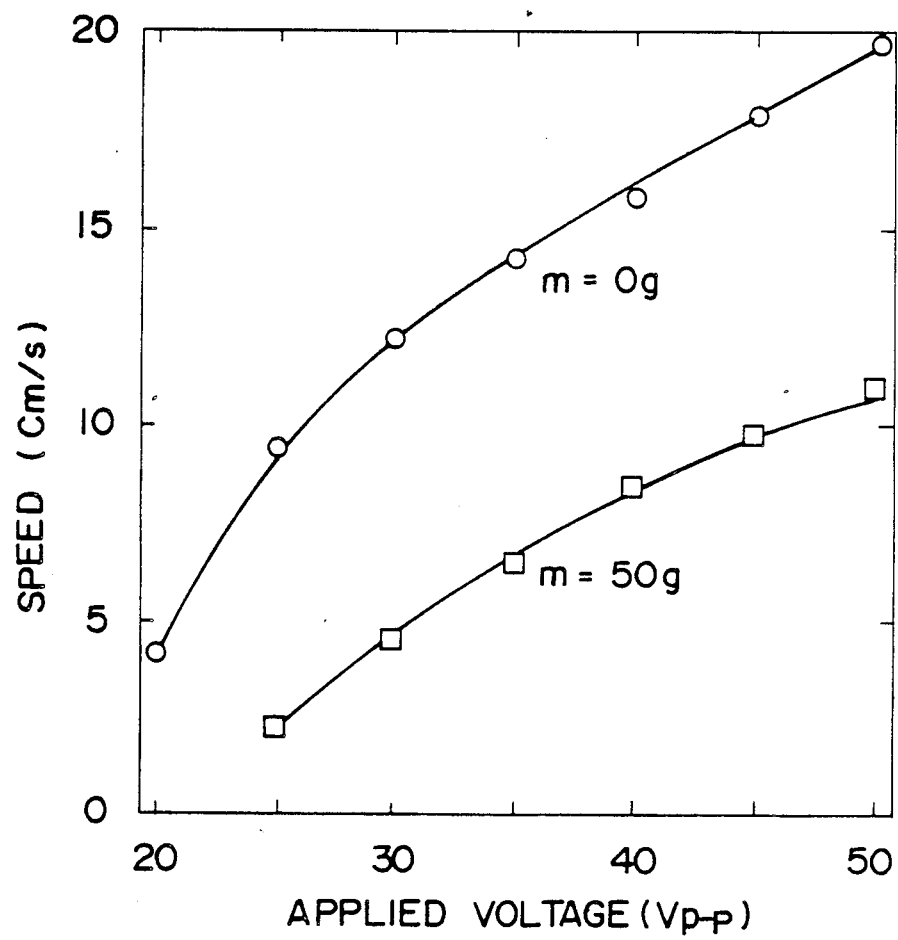
FIG. 28 shows a characteristic drawing representing the relationship between the applied voltage and the moving speed of the piezoelectric vibrator in the embodiment shown in FIGS. 24A and 24B.

FIG. 28 is a characteristic graph representing a relationship between applied voltage and moving speed of the piezoelectric vibrator with the weight parameters m=0 g and m=50 g of the object placed on slide frame 64. The moving speed 20 cm/sec has been obtained with m=0 when the ac voltage of 50 V is applied.

Figure 29:
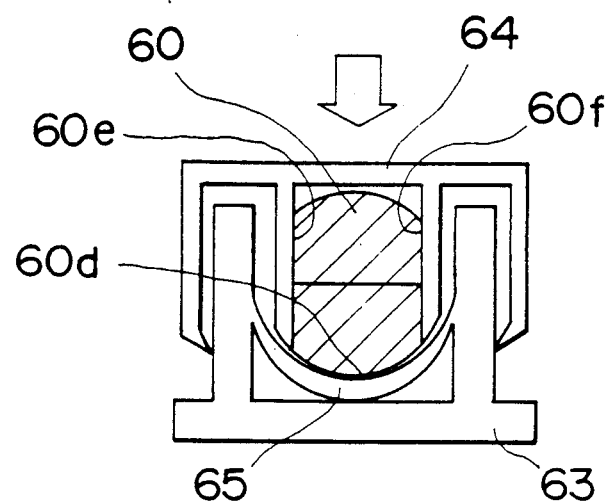
FIG. 29 shows a side sectional plan view representing a modified embodiment of that shown in FIGS. 24A and 24B.
Figure 30:
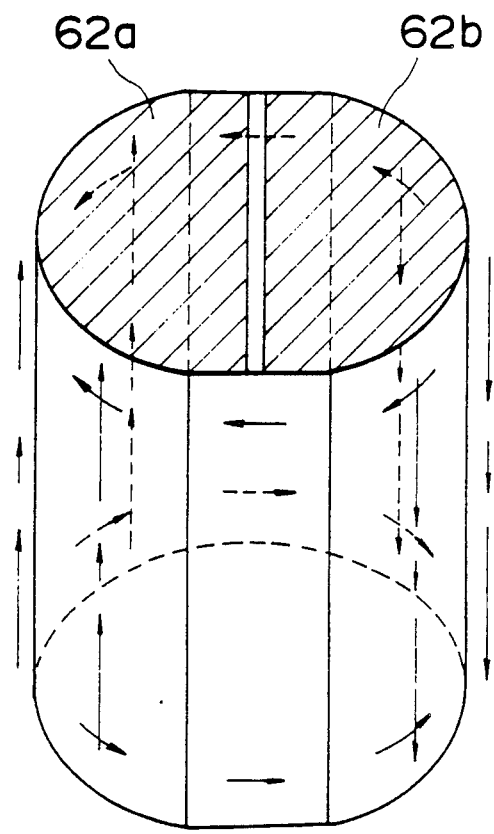
FIG. 30 shows a drawing representing the vibration displacement appearing on the cylindrical side in the embodiment shown in FIG. 29.

FIG. 29 is a side sectional view of another embodiment according to the present invention. FIG. 30 is a distribution graph of the vibration displacement appearing on the piezoelectric vibrator of the embodiment in FIG. 29. The difference of the embodiment in FIG. 29 from that in FIG. 24 resides in the fixing structure between the piezoelectric vibrator and the slide frame. In the embodiment shown in FIG. 29, the piezoelectric vibrator has a modified cylindrical shape in that both sides are flattened. On the flat sides of the cylindrical piezoelectric vibrator there are produced the minimum vibration displacement. The flat sides are fixed to slide frame 64. As seen from FIG. 30, the modified cylindrical shape piezoelectric vibrator has essentially the same vibration displacement as that of the cylindrical piezoelectric vibrator.

By employing the structure shown in FIG. 29 for fixing the piezoelectric vibrator the influence of the fixing on the vibration displacement distribution becomes small and it is possible to easily and reliably fix the piezoelectric vibrator to the slide.

According to the embodiments shown in FIGS. 24 and 29, the following advantages are obtained. The number of parts becomes small. The piezoelectric vibrator is extremely small and is capable of producing a large torque. The moving direction may be controlled by a simple driving circuit of the switch and the single-phase ac power source. Linear or curve movement is made possible by the rail guidance.

Although in the above-described embodiment the alternative voltage is supplied from the external power source (battery) and the switch on the piezoelectric vibrator eliminates the need for flexible wire. The switch may be controlled by an electromagnetic wave, eliminating the limit on the moving range of the piezoelectric vibrator due to the length of the wire.

Although the invention has been described with respect to specific embodiments, it should be obvious that there are numerous variations within the scope of the present invention. Thus, the present invention is intended to cover not only the described embodiments, but also those variations falling within the scope of the appended claims.

What is claimed is:

1. A vibrator-type actuator comprising:
   a pillar shaped ceramic piezoelectric body having a base surface at each end and a plurality of plane surfaces along the longitudinal direction formed at the symmetrical positions with regard to the axis direction of said piezoelectric body, said pillar shaped ceramic piezoelectric body being polarized in the longitudinal direction;
   a pair of electrodes formed on both base surfaces of said piezoelectric body; and
   a moving element made to contact with a side surface of said piezoelectric body in the longitudinal direction.

2. An actuator according to claim 1, the lengths of said piezoelectric body in the radial and longitudinal direction being substantially the same.

3. An actuator according to claim 1, further comprising driving circuit means for supplying a driving signal to said piezoelectric body.

4. An actuator according to claim 1, said piezoelectric body being substantially cylindrical.

5. An actuator according to claim 3, said driving signal being an alternative signal having almost the same frequency as the resonance frequency of said piezoelectric body.

6. An actuator according to claim 3, said driving signal being a pulse signal of substantially the same frequency as the resonance frequency of said piezoelectric body.

7. An actuator according to claim 1, further comprising pressing means for pressing said piezoelectric body against said moving element.

8. An actuator according to claim 1, one electrode of said paired electrodes being electrically separated into two electrodes and said driving signal being alternatively supplied between one of said separated electrodes through a switch means and the other electrode of said pair electrodes.

9. An actuator according to claim 1, further comprising a roller provided between said piezoelectric body and said moving element for transmitting driving force to said moving element.

10. An actuator according to claim 9, further comprising means for maintaining the contact pressure between said roller and said piezoelectric body and between said roller and said moving element.

11. An actuator according to claim 9, having a metal layer formed on the surface of said piezoelectric body and said piezoelectric body contacting with said roller at said metal layer.

12. A paper feed apparatus comprising:
   a pillar shaped piezoelectric vibrator having two base surfaces on which a pair of electrodes are formed;
   a first roller made to contact with a side surface of said piezoelectric vibrator in the longitudinal direction and rotated by a circumference direction force due to the driving of said piezoelectric vibrator;
   a supporting means for maintaining the distance between the rotational axis of said first roller and said piezoelectric vibrator to stably apply a contact pressure between said first roller and said piezoelectric vibrator; and
   a pressing means for pressing said first roller against a paper.

13. An apparatus according to claim 12, wherein said pressing means includes a second roller for rotating around the axis parallel to the axis of said first roller and a holding means for holding the paper between said first and second rollers with a predetermined pressure.

14. An apparatus according to claim 12, one electrode of the pair of electrodes being electrically separated into two electrodes and said driving signal being supplied to one of said separated electrodes through a switch means.

15. An apparatus according to claim 12, said pillar shaped piezoelectric vibrator being square shaped in cross section.

16. An apparatus according to claim 12, at lease a part of a side surface of said piezoelectric vibrator being a flat plane.

17. An apparatus according to claim 12, a metal layer being formed on a part of a surface of said piezoelectric vibrator and said first roller being made to contact with said metal layer.

18. A moving apparatus comprising:
   a pillar shaped piezoelectric body having two base surfaces perpendicular to the poling axis on which a pair of electrodes are formed and two flat surfaces provided at symmetrical positions;
   a driving circuit means for supplying a driving signal to said pair of electrodes;
   a rail at least a part of which being made to contact with the side surface, in the longitudinal direction, of said piezoelectric body and which guides the movement of said piezoelectric body, the sectional shape of said rail being U-shaped and the base portion of said U-shaped rail being made to contact with the side surface in the longitudinal direction of said piezoelectric body with a predetermined contact pressure; and
   a slide frame fixed with said piezoelectric body at said flat surfaces.

19. An apparatus according to claim 18, said pillar shaped piezoelectric body being a cylindrical piezoelectric body.

* * * * *